US010304623B2

(12) United States Patent
Song et al.

(10) Patent No.: US 10,304,623 B2
(45) Date of Patent: May 28, 2019

(54) INTEGRATED DEVICE PACKAGE COMPRISING A TUNABLE INDUCTOR

(71) Applicant: QUALCOMM Incorporated, San Diego, CA (US)

(72) Inventors: Young Kyu Song, San Diego, CA (US); John Jong Hoon Lee, San Diego, CA (US); Sangjo Choi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/002,174

(22) Filed: Jan. 20, 2016

(65) Prior Publication Data

US 2017/0207022 A1    Jul. 20, 2017

(51) Int. Cl.

| | | |
|---|---|---|
| *G06F 1/16* | (2006.01) | |
| *H01F 29/02* | (2006.01) | |
| *G05B 19/10* | (2006.01) | |
| *H01F 27/29* | (2006.01) | |
| *H01F 27/42* | (2006.01) | |
| *H05K 7/14* | (2006.01) | |

(Continued)

(52) U.S. Cl.
CPC ......... *H01F 29/025* (2013.01); *G05B 19/106* (2013.01); *G06F 1/1633* (2013.01); *H01F 27/29* (2013.01); *H01F 27/42* (2013.01); *H01L 23/498* (2013.01); *H01L 23/49822* (2013.01); *H01L 23/645* (2013.01); *H05K 7/1485* (2013.01); *G05B 2219/25087* (2013.01); *H01L 23/3128* (2013.01); *H01L 2224/131* (2013.01);

(Continued)

(58) Field of Classification Search
CPC ............................. H01F 29/025; H01F 27/29
See application file for complete search history.

(56) References Cited

U.S. PATENT DOCUMENTS

| 6,573,822 B2 | 6/2003 | Ma et al. |
|---|---|---|
| 7,012,323 B2 | 3/2006 | Warner et al. |

(Continued)

FOREIGN PATENT DOCUMENTS

| EP | 2662870 A1 | 11/2013 |
|---|---|---|
| JP | 2013110351 A | 6/2013 |

OTHER PUBLICATIONS

International Search Report and Written Opinion—PCT/US2017/013997—ISA/EPO—dated Apr. 3, 2017.

*Primary Examiner* — William H. Mayo, III
*Assistant Examiner* — Hiram E Gonzalez
(74) *Attorney, Agent, or Firm* — Loza & Loza, LLP/Qualcomm

(57) ABSTRACT

Some features pertain to a package substrate that includes at least one dielectric layer, an inductor in the at least one dielectric layer, a first terminal coupled to the inductor, a second terminal coupled to the inductor, and a third terminal coupled to the inductor. The first terminal is configured to be a first port for the inductor. The second terminal is configured to be a second port for the inductor. The third terminal is a dummy terminal. In some implementations, the package substrate includes a solder resist layer over the dielectric layer, where the solder resist layer covers the third terminal. In some implementations, the package substrate includes a solder interconnect over the third terminal, such that the solder resist layer is between the third terminal and the solder interconnect. In some implementations, the package substrate is coupled to a die comprising a plurality of switches.

20 Claims, 19 Drawing Sheets

PLAN VIEW

(51) Int. Cl.
*H01L 23/498* (2006.01)
*H01L 23/64* (2006.01)
*H01L 23/31* (2006.01)

(52) U.S. Cl.
CPC .............. *H01L 2224/16227* (2013.01); *H01L 2224/16265* (2013.01); *H01L 2224/32225* (2013.01); *H01L 2224/73204* (2013.01); *H01L 2224/92125* (2013.01); *H01L 2924/15311* (2013.01); *H01L 2924/19011* (2013.01); *H01L 2924/19042* (2013.01)

(56) References Cited

U.S. PATENT DOCUMENTS

| | | | |
|---|---|---|---|
| 7,064,645 B2 * | 6/2006 | Kobayashi | H01F 17/0006 257/E23.114 |
| 7,202,768 B1 * | 4/2007 | Harvey | H01F 21/08 333/174 |
| 7,336,147 B2 * | 2/2008 | Watanabe | H01F 17/0006 257/531 |
| 7,365,628 B2 | 4/2008 | Sato et al. | |
| 7,460,001 B2 | 12/2008 | Jessie | |
| 7,531,407 B2 | 5/2009 | Clevenger et al. | |
| 7,598,838 B2 * | 10/2009 | Hargrove | H01F 17/0013 333/174 |
| 7,868,409 B2 * | 1/2011 | Sasaki | H01L 23/49822 257/491 |
| 8,441,334 B2 | 5/2013 | Kawano | |
| 9,806,694 B2 | 10/2017 | Reedy et al. | |
| 2011/0260819 A1 | 10/2011 | Yeh et al. | |
| 2012/0038025 A1 | 2/2012 | Teggatz et al. | |
| 2013/0242499 A1 * | 9/2013 | Kang | G06K 19/07732 361/679.32 |
| 2014/0246753 A1 | 9/2014 | Song et al. | |
| 2014/0333391 A1 | 11/2014 | Tsuda | |
| 2017/0207293 A1 | 7/2017 | Song et al. | |

* cited by examiner

PLAN VIEW

PROFILE VIEW

FIRST CONFIGURATION

SECOND CONFIGURATION

THIRD CONFIGURATION

INTEGRATED DEVICE PACKAGE COMPRISING A TUNABLE INDUCTOR

BACKGROUND

Field

Various features relate generally to an integrated device package, and more specifically to an integrated device package that includes a tunable inductor implemented in a package substrate.

Background

FIG. 1 illustrates a configuration of an integrated device package that includes a die. Specifically, FIG. 1 illustrates an integrated device package 100 that includes a first die 102 and a package substrate 106. The package substrate 106 includes a dielectric layer and a plurality of interconnects 110. The package substrate 106 is a laminated substrate. The plurality of interconnects 110 includes traces, pads and/or vias. The first die 102 is coupled to the package substrate 106 through a first plurality of solder balls 112. The package substrate 106 is coupled to a printed circuit board (PCB) 108 through a second plurality of solder balls 116. FIG. 1 illustrates that an inductor 120 is mounted on the PCB 108. The inductor 120 is located externally of the integrated device package 100, and takes up a lot real estate on the PCB 108. The inductor is a surface mounted inductor 120 is mounted on the PCB 108.

A drawback of the inductor 120 is that the property of the inductor 120 is fixed and cannot be tuned and/or configured to meet changing operational conditions of the first die 102. That is, for example, the inductor 120 has a fixed inductance value, which cannot be changed during the operation of the first die 102.

Another drawback of the inductor 120 shown in FIG. 1 is that it creates a device with a form factor that may be too large for the needs of mobile computing devices and/or wearable computing devices. This may result in a device that is either too large and/or too thick. That is, the combination of the integrated device package 100, the inductor 120 and the PCB 108 shown in FIG. 1 may be too thick and/or have a surface area that is too large to meet the needs of mobile computing devices and/or wearable computing devices.

Therefore, there is a need for an integrated device package with a tunable inductor. Ideally, such an integrated device package will include a compact form factor, while at the same time meeting the needs of mobile devices, Internet of Things (IoT) devices, computing devices and/or wearable computing devices.

SUMMARY

Various features relate generally to an integrated device package, and more specifically to an integrated device package that includes a tunable inductor implemented in a package substrate.

For example, a package substrate includes at least one dielectric layer, an inductor in the at least one dielectric layer, a first terminal coupled to the inductor, a second terminal coupled to the inductor, and a third terminal coupled to the inductor. The first terminal is configured to be a first port for the inductor. The second terminal is configured to be a second port for the inductor. The third terminal is a dummy terminal.

For example, a package substrate includes at least one dielectric layer, a means for inductance in the at least one dielectric layer, a first terminal coupled to the means for inductance, a second terminal coupled to the means for inductance, and a third terminal coupled to the means for inductance. The first terminal is configured to be a first port for the means for inductance. The second terminal is configured to be a second port for the means for inductance. The third terminal is a dummy terminal.

In another example, a method for tuning an inductor includes specifying a first inductance for an inductor coupled to a first terminal, a second terminal, and a third terminal, where the first terminal is configured to be a first port for the inductor. The method closes a first switch coupled to the second terminal such that the second terminal is configured to be a second port for the inductor. The method opens a second switch coupled to the third terminal such that the third terminal is configured as a first dummy terminal for the inductor. The method of closing the first switch and opening the second switch configures the inductor to comprise the first inductance when a current traverses through the inductor between the first port and the second port.

In another example, a processor readable storage medium that includes code for specifying a first inductance for an inductor coupled to a first terminal, a second terminal, and a third terminal, where the first terminal is configured to be a first port for the inductor. The processor readable storage medium further includes code for closing a first switch coupled to the second terminal such that the second terminal is configured to be a second port for the inductor. The processor readable storage medium also includes code for opening a second switch coupled to the third terminal such that the third terminal is configured as a first dummy terminal for the inductor. The processor readable storage medium that includes code for closing the first switch and opening the second switch configures the inductor to comprise the first inductance when a current traverses through the inductor between the first port and the second port.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to a package substrate that includes at least one dielectric layer, an inductor in the at least one dielectric layer, a first terminal coupled to the inductor, a second terminal coupled to the inductor, and a third terminal coupled to the inductor. The first terminal is configured to be a first port for the inductor. The second terminal is configured to be a second port for the inductor. The third terminal is a dummy terminal. In some implementations, the package substrate includes a solder resist layer over the dielectric layer, where the solder resist layer covers the third terminal. In some implementations, the package substrate includes a solder interconnect over the third terminal, such that the solder resist layer is between the third terminal and the solder interconnect. In some implementations, the package substrate is coupled to a die comprising a plurality of switches.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., data signal, ground signal, power signal). An interconnect may be part of a circuit. An interconnect may include more than one element or component.

Exemplary Tunable Inductor

Figure 1:
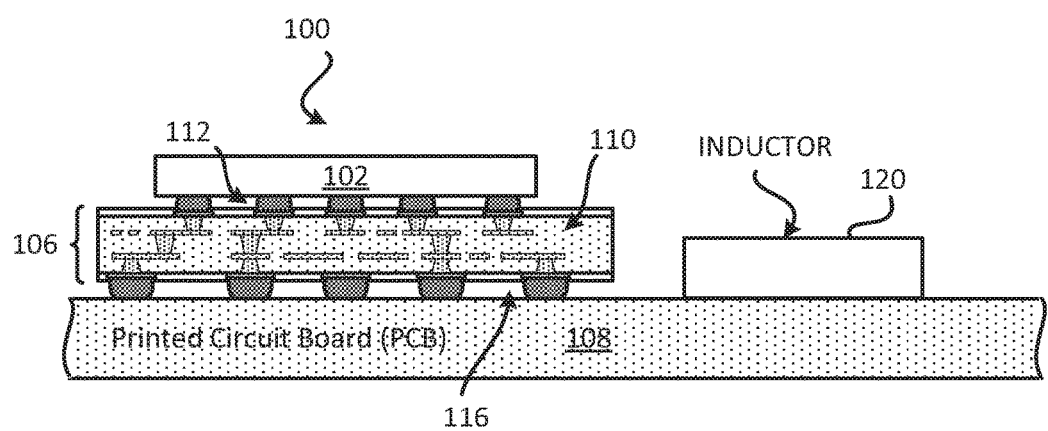
FIG. 1 illustrates a profile view of an integrated device package and an inductor mounted on a printed circuit board (PCB).
Figure 2:
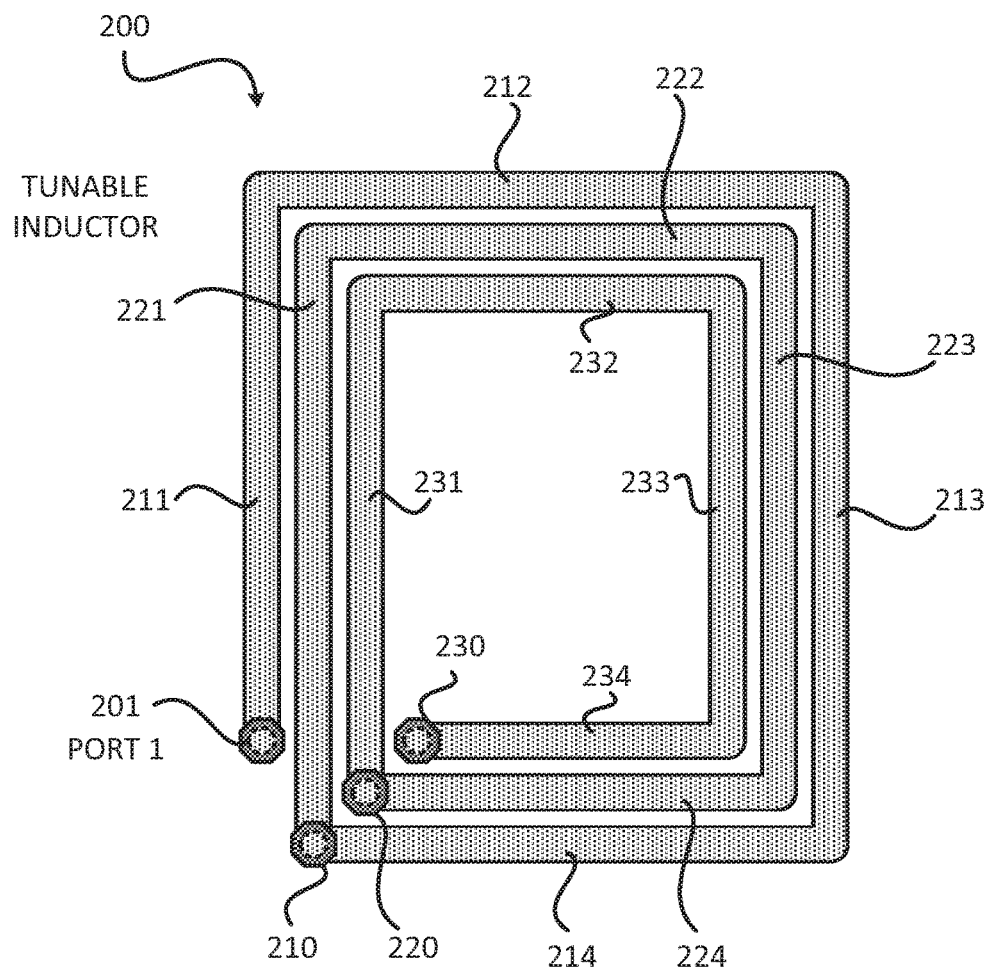
FIG. 2 illustrates a plan view of a tunable inductor.

FIG. 2 illustrates an example of a tunable inductor 200. In some implementations, the tunable inductor 200 is implemented as an integrated passive device (IPD). Examples of a tunable inductor implemented as an integrated passive device (IPD) are further described in at least FIGS. 4-5, 7, 9, 11-15 and 18-19. In some implementations, the tunable inductor 200 is at least partially implemented in a package substrate. Examples of a tunable inductor at least partially implemented in a package substrate are further described in at least FIGS. 16-17. The tunable inductor may be a tunable inductive means or means for tunable inductance.

In some implementations, the tunable inductor 200 is configurable (e.g., tunable) to have different inductance, through the use of dummy interconnects and/or dummy terminals. The use of dummy interconnects and/or dummy terminals with a tunable inductor, is further described below in at least FIGS. 4-17.

In some implementations, the tunable inductor 200 is configurable to have different inductances, through the use of one or more switches. The use of switches with a tunable inductor, is further described below in at least FIGS. 18-23.

As shown in FIG. 2, the tunable inductor 200 includes one or more interconnects (e.g., interconnect 211, interconnect 212, interconnect 213, interconnect 214, interconnect 221, interconnect 222, interconnect 223, interconnect, 224, interconnect 231, interconnect 232, interconnect 233, interconnect 234). In some implementations, one interconnect may collectively be defined by one or more of the interconnect 211, the interconnect 212, the interconnect 213, the interconnect 214, the interconnect 221, the interconnect 222, the interconnect 223, the interconnect 224, the interconnect 231, the interconnect 232, the interconnect 233, and the interconnect 234. An interconnect (e.g., interconnect 211) may include a trace and/or pad.

The tunable inductor 200 includes a first terminal 201, a second terminal 210, a third terminal 220, and a fourth terminal 230. The first terminal 201 may include at least one interconnect (e.g., trace, pad, via). The first terminal 201 may be a first port for the tunable inductor 200.

The second terminal 210 may include at least one interconnect (e.g., trace, pad, via). The third terminal 220 may include at least one interconnect (e.g., trace, pad, via). The fourth terminal 230 may include at least one interconnect (e.g., trace, pad, via). In some implementations, the tunable inductor 200 may be configured (e.g., tuned) to have different inductances, by selecting the second terminal 210, the third terminal 220, or the fourth terminal 230, as the second port for the tunable inductor 200.

As will be further described below in FIGS. 5-10, the tunable inductor 200 that includes the first terminal 201 (e.g., first port) and the second terminal 210 (e.g., second port), may be a one turn inductor with a first inductance ($L_1$). The tunable inductor 200 that includes the first terminal 201 (e.g., first port) and the third terminal 220 (e.g., second port), may be a two turn inductor with a second inductance ($L_2$). The tunable inductor 200 that includes the first terminal 201 (e.g., first port) and the fourth terminal 230 (e.g., second port), may be a three turn inductor with a third inductance ($L_3$).

Different implementations may use different terminals as the ports for the tunable inductor 200. For example, in some implementations, the second terminal 210 and the third terminal 220 may respectfully correspond to the first port and the second port for the tunable inductor 200.

In some implementations, terminals that are used as ports are live terminals and terminals that are not used as ports are dummy terminals. In some implementations, a dummy terminal may include one or more interconnects that is an end point for an electrical path, where a signal cannot traverse through the dummy terminal.

As shown in FIG. 2, the tunable inductor 200 is a spiral inductor that includes three turns. However, in different implementations, the tunable inductor 200 may include a different number of turns (e.g., 1, 2, 4).

Exemplary Integrated Passive Device (IPD) Comprising Tunable Inductor

Figure 3:
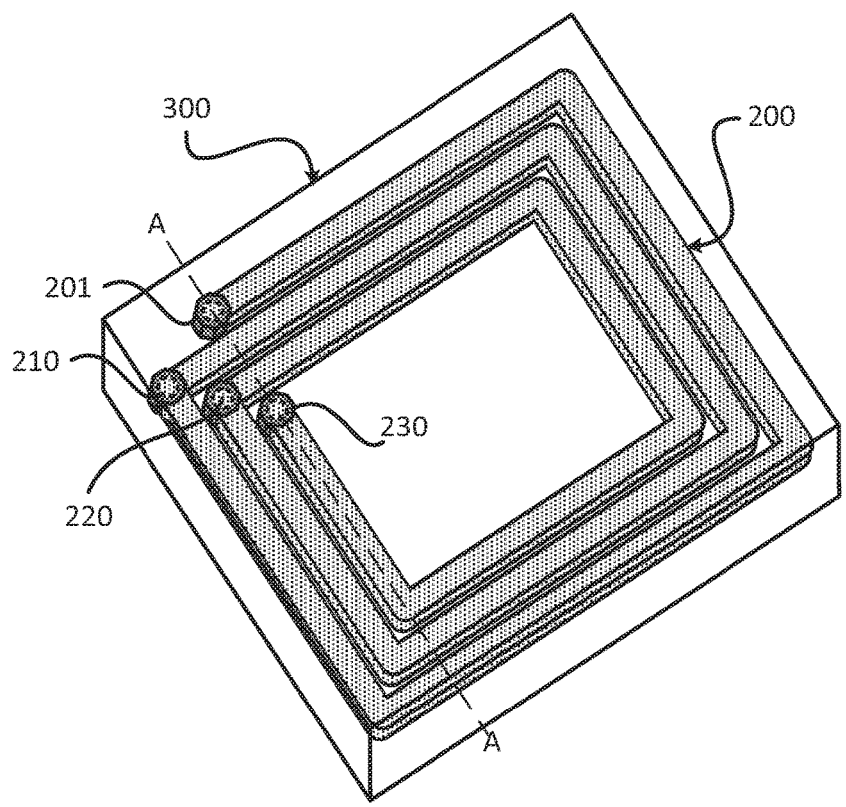
FIG. 3 illustrates a view of an integrated passive device (IPD) that includes a tunable inductor.
Figure 4:
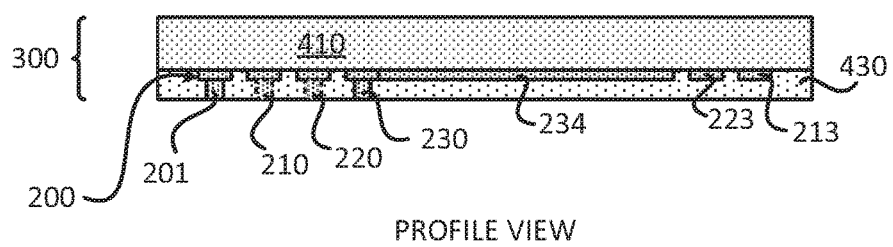
FIG. 4 illustrates a profile view of an integrated passive device (IPD) that includes a tunable inductor.

As mentioned above, in some implementations, the tunable inductor 200 is implemented as an integrated passive device (IPD). FIGS. 3 and 4 illustrate an example of an integrated passive device (IPD) 300 that include the tunable inductor 200. The tunable inductor may be a tunable inductive means or means for tunable inductance.

FIG. 4 illustrates a profile view of the integrated passive device (IPD) 300 across the cross-section AA of FIG. 3. The integrated passive device (IPD) 300 includes a substrate 410, a dielectric layer 430, the tunable inductor 200, the first terminal 201, the second terminal 210, the third terminal 220, and the fourth terminal 230. The tunable inductor 200 includes at least the interconnects 213, 223, and the 234. The tunable inductor 200 is formed over the substrate 410. The substrate 410 may include a substrate (e.g., silicon substrate, glass substrate, ceramic substrate). The dielectric layer 430 is formed over the substrate 410 and the tunable inductor 200.

As shown in FIG. 4, the first terminal 201 includes at least one interconnect (e.g., trace, pad, via) formed in the dielectric layer 430; the second terminal 210 includes at least one interconnect (e.g., trace, pad, via) formed in the dielectric layer 430; the third terminal 220 includes at least one interconnect (e.g., trace, pad, via) formed in the dielectric layer 430; and the fourth terminal 230 includes at least one interconnect (e.g., trace, pad, via) formed in the dielectric layer 430.

As will be further described below in FIGS. 5-10, the tunable inductor 200 may be configured (e.g., tuned) to have different inductances by using two terminals as ports, and leaving two terminals as dummy terminals. In some implementations, the two dummy terminals may be covered by a solder resist layer, which prevents an electrical connection with the dummy terminals of the tunable inductor 200.

Figure 5:
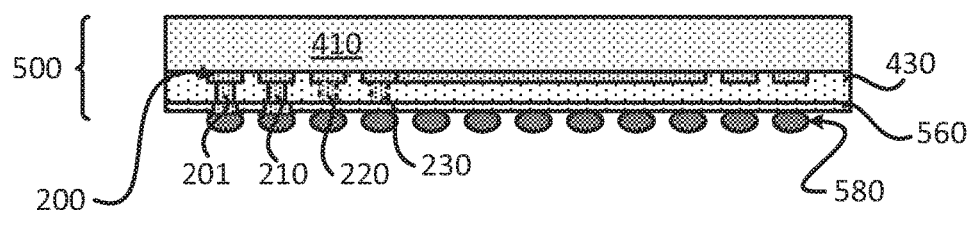
FIG. 5 illustrates a profile view of an integrated passive device (IPD) that includes a tunable inductor.

FIG. 5 illustrates an example of a first configuration of the integrated passive device (IPD) 500. The integrated passive device (IPD) 500 includes the substrate 410, the dielectric layer 430, the tunable inductor 200, the first terminal 201, the second terminal 210, the third terminal 220, the fourth terminal 240, the solder resist layer 560, and a plurality of solder interconnects 580 (e.g., solder balls).

As shown in FIG. 5, the first terminal 201 and the second terminal 210 are live terminals (e.g., first port, second port), and the third terminal 220 and the fourth terminal 230 are dummy terminals. The first terminal 201 includes interconnects (e.g., pad, trace, via) that are coupled to a first solder interconnect from the plurality of solder interconnects 580. The second terminal 210 includes interconnects (e.g., pad, trace, via) that are coupled to a second solder interconnect from the plurality of solder interconnects 580.

The dummy terminals (e.g., third terminal 220, fourth terminal 230) are covered by the solder resist layer 560. The dummy terminals are not coupled (e.g., electrically coupled) to solder interconnects from the plurality of solder interconnects 580. Thus, there is a solder interconnect underneath the dummy terminals, but no electrical coupling or direct coupling between the solder interconnect and the dummy terminals.

Figure 6:
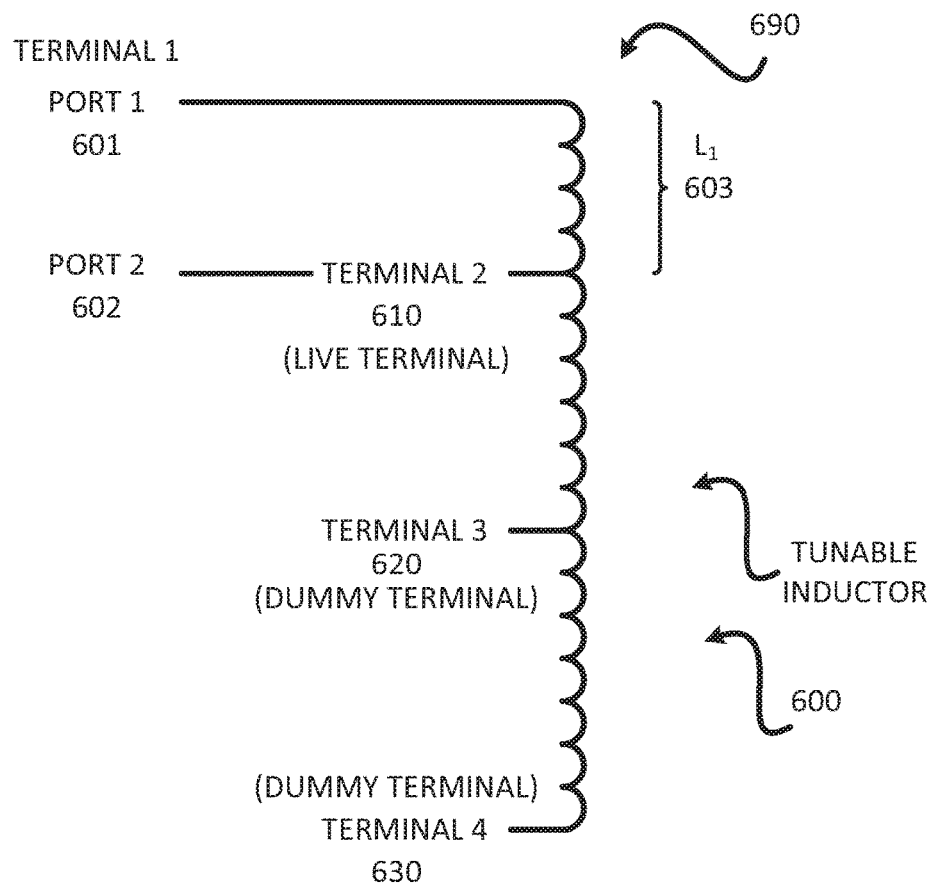
FIG. 6 illustrates a circuit diagram of a tunable inductor.

FIG. 6 illustrates a circuit diagram 690 of the inductor 600. The inductor 600 of FIG. 6 may correspond to the integrated passive device (IPD) 500 that includes the tunable inductor 200 of FIG. 5. The inductor 600 includes a first terminal 601, a second terminal 610, a third terminal 620, a fourth terminal 630. The first terminal 601 may correspond to the first terminal 201 of FIG. 5, the second terminal 610 may correspond to the second terminal 210 of FIG. 5, the third terminal 620 may correspond to the third terminal 220 of FIG. 5, and the fourth terminal 630 may correspond to the fourth terminal of FIG. 5.

As shown in FIG. 6, when the inductor 600 includes the first terminal 601 as the first port, and the second terminal 610 as the second port, the inductor 600 has a first inductance ($L_1$) 603. The first terminal 601 and the second terminal 610 are live terminals, and the third terminal 620 and the fourth terminal 630 are dummy terminals.

Figure 7:
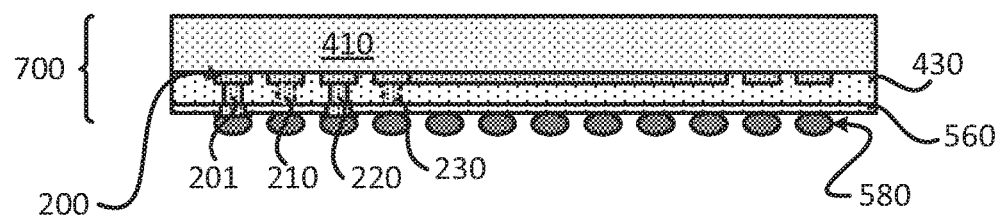
FIG. 7 illustrates a profile view of an integrated passive device (IPD) that includes a tunable inductor.

FIG. 7 illustrates an example of a second configuration of the integrated passive device (IPD) 700. FIG. 7 is similar to FIG. 5, except that different terminals are live. As shown in FIG. 7, the first terminal 201 and the third terminal 220 are live terminals (e.g., first port, second port), and the second terminal 210 and the fourth terminal 230 are dummy terminals. The first terminal 201 includes interconnects (e.g., pad, trace, via) that are coupled to a first solder interconnect from the plurality of solder interconnects 580. The third terminal 220 includes interconnects (e.g., pad, trace, via) that are coupled to a second solder interconnect from the plurality of solder interconnects 580.

The dummy terminals (e.g., second terminal 210, fourth terminal 230) are covered by the solder resist layer 560. The dummy terminals are not coupled (e.g., electrically coupled) to solder interconnects from the plurality of solder interconnects 580. Thus, there is a solder interconnect underneath the dummy terminals, but no electrical coupling or direct coupling between the solder interconnect and the dummy terminals.

Figure 8:
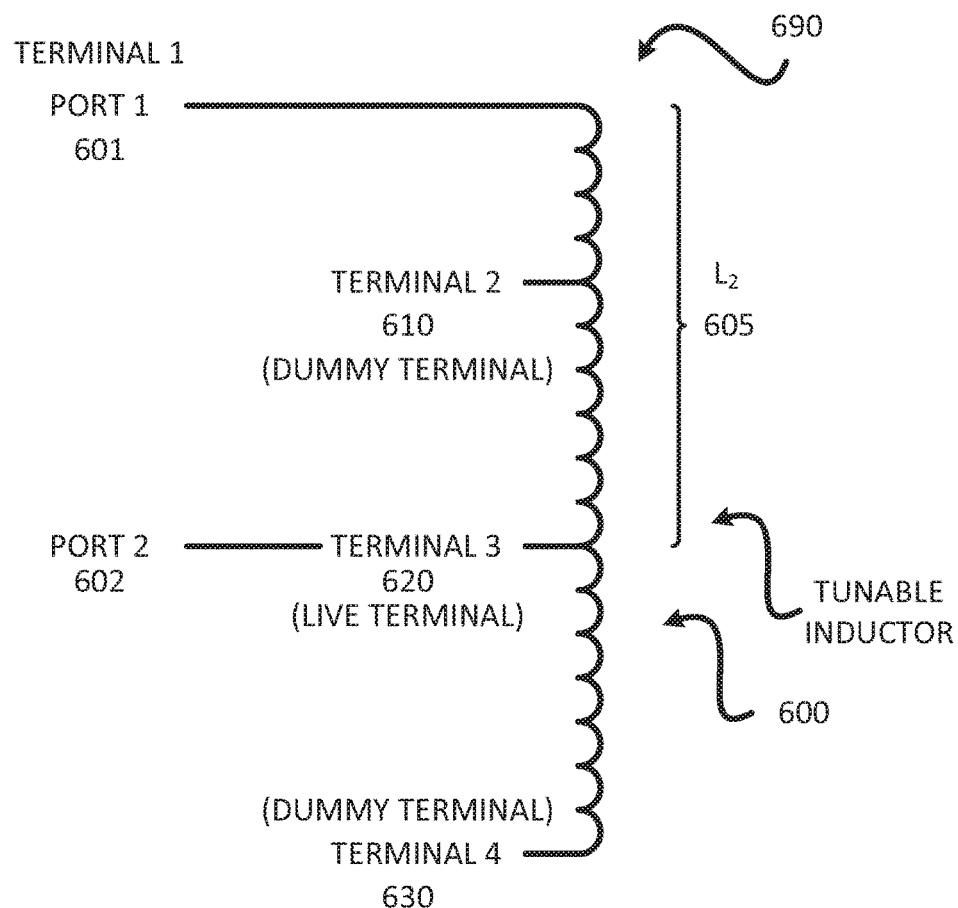
FIG. 8 illustrates a circuit diagram of a tunable inductor.

FIG. 8 illustrates the circuit diagram 690 of the inductor 600. The inductor 600 of FIG. 8 may correspond to the integrated passive device (IPD) 700 that includes the tunable inductor 200 of FIG. 7. As shown in FIG. 8, when the inductor 600 includes the first terminal 601 as the first port, and the third terminal 620 as the second port, the inductor 600 has a second inductance ($L_2$) 605. The first terminal 601 and the third terminal 620 are live terminals, and the second terminal 610 and the fourth terminal 630 are dummy terminals.

Figure 9:
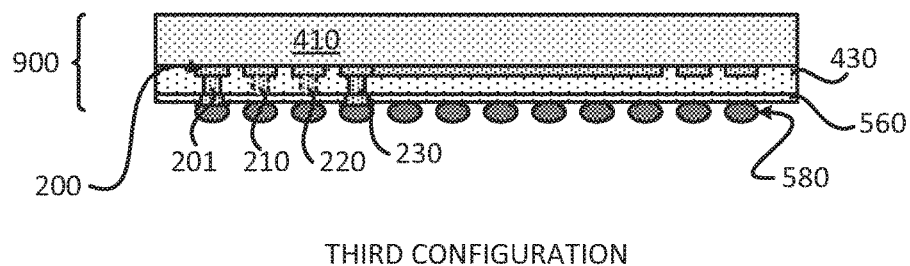
FIG. 9 illustrates a profile view of an integrated passive device (IPD) that includes a tunable inductor.

FIG. 9 illustrates an example of a second configuration of the integrated passive device (IPD) 900. FIG. 9 is similar to FIG. 5, except that different terminals are live. As shown in FIG. 9, the first terminal 201 and the fourth terminal 230 are live terminals (e.g., first port, second port), and the second terminal 210 and the third terminal 220 are dummy terminals. The first terminal 201 includes interconnects (e.g., pad, trace, via) that are coupled to a first solder interconnect from the plurality of solder interconnects 580. The fourth terminal 230 includes interconnects (e.g., pad, trace, via) that are coupled to a second solder interconnect from the plurality of solder interconnects 580.

The dummy terminals (e.g., second terminal 210, third terminal 220) are covered by the solder resist layer 560. The dummy terminals are not coupled (e.g., electrically coupled) to solder interconnects from the plurality of solder interconnects 580. Thus, there is a solder interconnect underneath the dummy terminals, but no electrical coupling or direct coupling between the solder interconnect and the dummy terminals.

Figure 10:
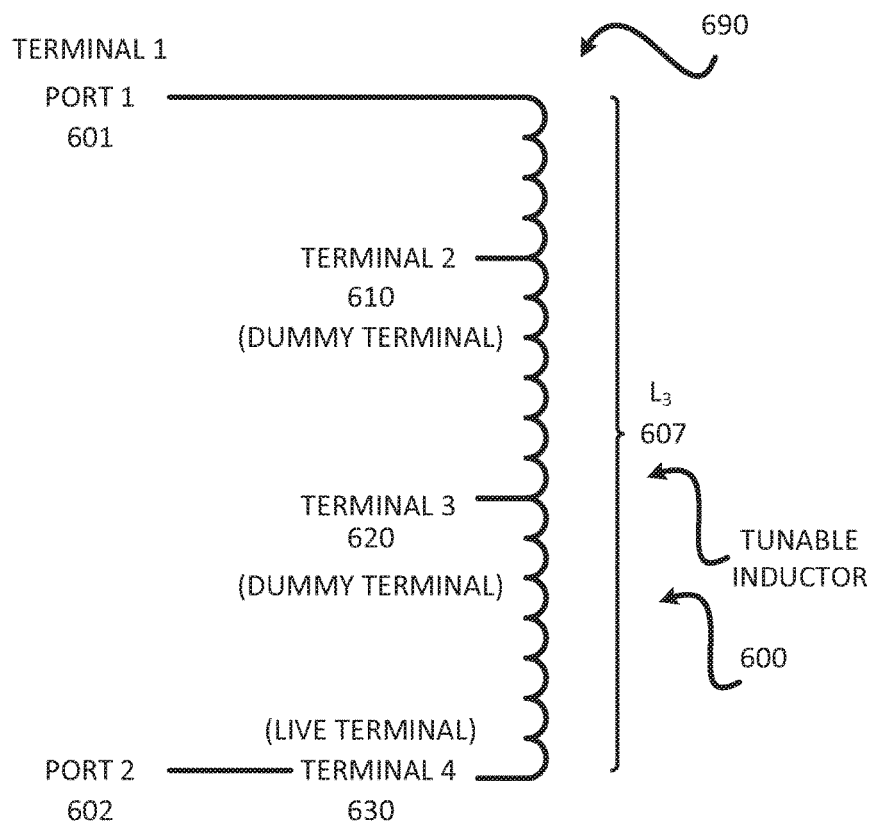
FIG. 10 illustrates a circuit diagram of a tunable inductor.

FIG. 10 illustrates the circuit diagram 690 of the inductor 600. The inductor 600 of FIG. 10 may correspond to the integrated passive device (IPD) 900 that includes the tunable inductor 200 of FIG. 9. As shown in FIG. 10, when the inductor 600 includes the first terminal 601 as the first port, and the fourth terminal 630 as the second port, the inductor 600 has a third inductance ($L_3$) 607. The first terminal 601 and the fourth terminal 630 are live terminals, and the second terminal 610 and the third terminal 620 are dummy terminals.

Thus, FIGS. 5-10 illustrate that by covering different terminals of an inductor with a solder resist layer, the inductor can be configured to have different inductances. The integrated passive devices (IPDs) of the present disclosure may be coupled to a substrate (e.g., package substrate, laminated substrate) and/or a printed circuit board (PCB).

Figure 11:
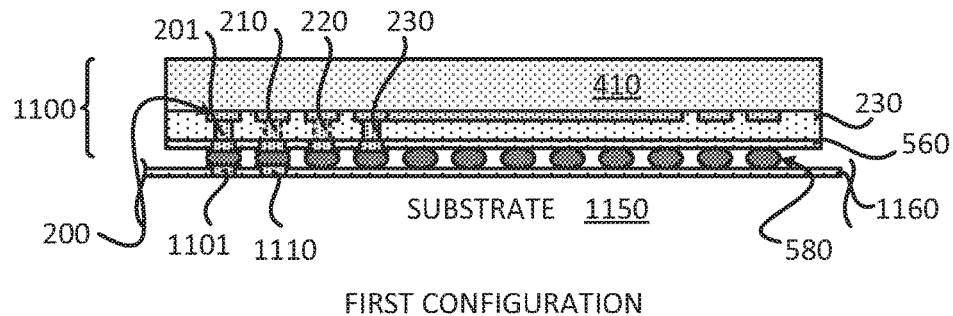
FIG. 11 illustrates a profile view of an integrated passive device (IPD) that includes a tunable inductor, coupled to a substrate.
Figure 12:
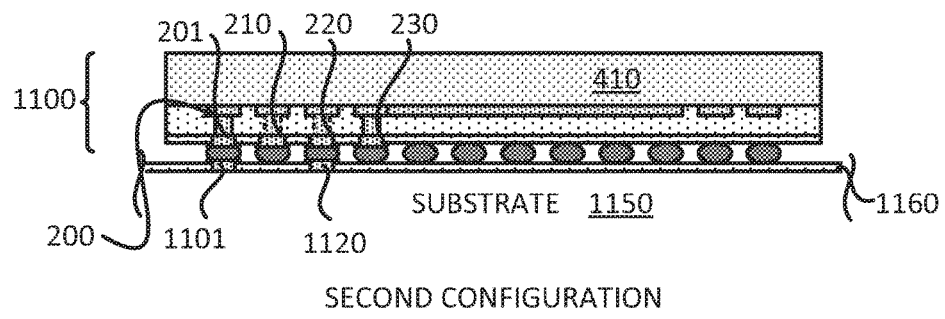
FIG. 12 illustrates a profile view of an integrated passive device (IPD) that includes a tunable inductor, coupled to a substrate.
Figure 13:
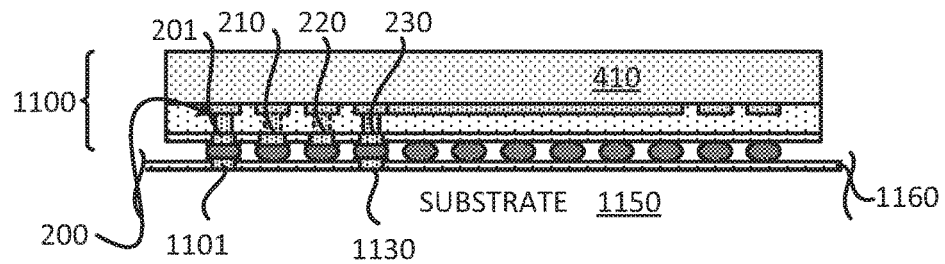
FIG. 13 illustrates a profile view of an integrated passive device (IPD) that includes a tunable inductor, coupled to a substrate.

FIGS. 11-13 illustrate how an integrated passive device (IPD) that includes an inductor may be coupled to a package substrate, a laminate substrate and/or a printed circuit board (PCB).

FIG. 11 illustrates a first configuration of an integrated passive device (IPD) 1100 that is coupled to a substrate 1150. The substrate 1100 includes a dielectric layer, a solder resist layer 1160, a first interconnect 1101, and a second interconnect 1110. The substrate 1150 may be a package substrate, a laminated substrate or a printed circuit board (PCB).

The integrated passive device (IPD) 1100 includes the substrate 410, the dielectric layer 430, the tunable inductor 200, the first terminal 201, the second terminal 210, the third terminal 220, the fourth terminal 240, the solder resist layer 560, and a plurality of solder interconnects 580 (e.g., solder balls). In some implementations, the first terminal 201, the second terminal 210, the third terminal 220, the fourth terminal 240 are coupled to a solder interconnect from the plurality of solder interconnects 580.

The integrated passive device (IPD) 1100 is coupled to the substrate 1150 such that the first terminal 201 is coupled to the first interconnect 1101, and the second terminal 210 is coupled to the second interconnect 1110. Thus, the first terminal 201 and the second terminal 210 are live terminals. The third terminal 220 and the fourth terminal 230 are dummy terminals, as they are coupled to the solder resist layer 1160 of the substrate 1150.

FIG. 12 illustrates a second configuration of the integrated passive device (IPD) 1100 that is coupled to a substrate 1150. As shown in FIG. 12, the integrated passive device (IPD) 1100 is coupled to the substrate 1150 such that the first terminal 201 is coupled to the first interconnect 1101, and the third terminal 220 is coupled to a third interconnect 1120. Thus, the first terminal 201 and the third terminal 220 are live terminals. The second terminal 210 and the fourth terminal 230 are dummy terminals, as they are coupled to the solder resist layer 1160 of the substrate 1150.

FIG. 13 illustrates a third configuration of the integrated passive device (IPD) 1100 that is coupled to a substrate 1150. As shown in FIG. 13, the integrated passive device (IPD) 1100 is coupled to the substrate 1150 such that the first terminal 201 is coupled to the first interconnect 1101, and the fourth terminal 230 is coupled to a fourth interconnect 1130. Thus, the first terminal 201 and the fourth terminal 230 are live terminals. The second terminal 210 and the third terminal 220 are dummy terminals, as they are coupled to the solder resist layer 1160 of the substrate 1150.

Figure 14:
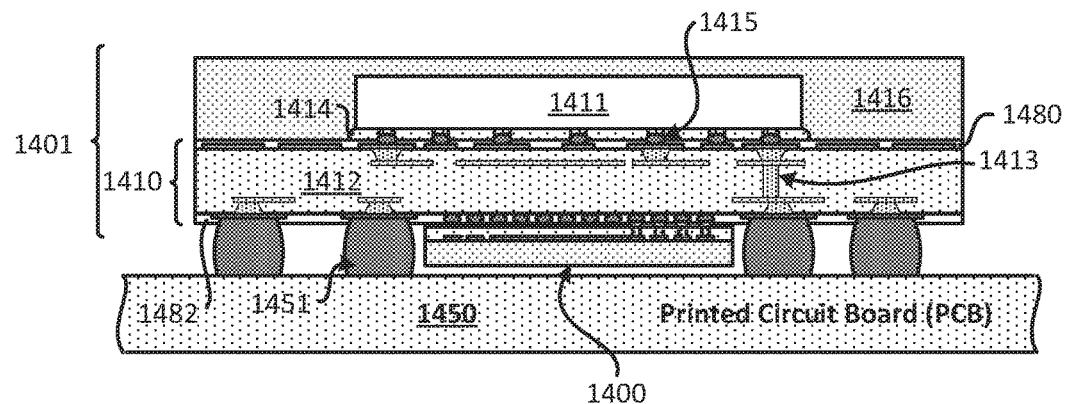
FIG. 14 illustrates a profile view of an integrated passive device (IPD) that includes a tunable inductor, coupled to a package.
Figure 15:
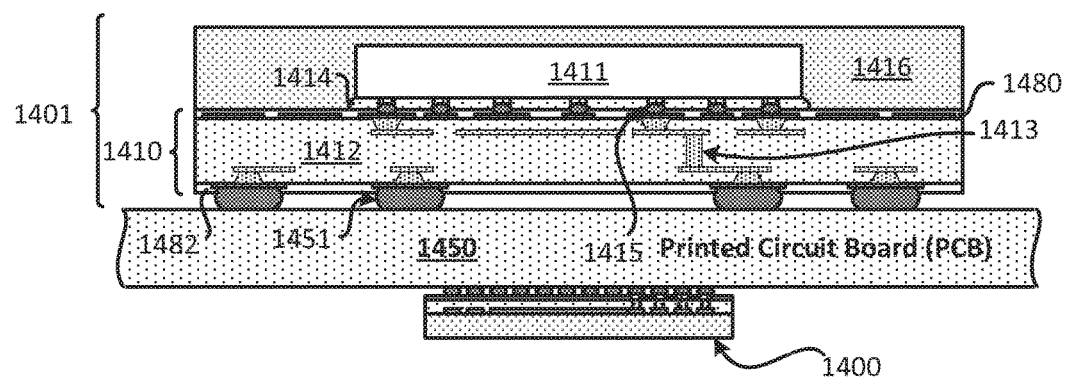
FIG. 15 illustrates a profile view of an integrated passive device (IPD) that includes a tunable inductor, coupled to a printed circuit board (PCB).

FIGS. 14 and 15 illustrate examples of where an integrated passive device (IPD) that includes a tunable inductor may be positioned. The tunable inductor may be a tunable inductive means or means for tunable inductance.

FIG. 14 illustrates an integrated device package 1401 that includes a package substrate 1410, a die 1411 and an integrated passive device (IPD) 1400 that includes a tunable inductor. The integrated passive device (IPD) 1400 may be any of the integrated passive device (IPD) that includes a tunable inductor, described in the present disclosure. The integrated device package 1401 is coupled to a printed circuit board (PCB) 1450 through a plurality of solder balls 1451.

As shown in FIG. 14, the integrated device package 1401 includes the package substrate 1410, the die 1411, an underfill 1414, a plurality of solder balls 1415, and an encapsulation layer 1416.

The package substrate 1410 includes at least one dielectric layer 1412. The at least one dielectric layer 1412 may include a core layer and/or a prepeg layer. The package substrate 1410 also include a plurality of interconnects 1413. The package substrate 1410 may also include a first solder resist layer 1480 and a second solder resist layer 1482. The first solder resist layer 1480 is formed on a first surface of the package substrate 1410, and the second solder resist layer 1482 is formed on a second surface of the package substrate 1410.

The integrated passive device (IPD) 1400 is coupled to the package substrate 1410. The die 1411 is coupled to the package substrate 1410 through the plurality of solder balls 1415. FIG. 14 illustrates that the integrated passive device (IPD) 1400 is coupled to the package substrate 1410 such that the integrated passive device (IPD) 1400 is face to face with the die 1411. That is, the front side of the integrated passive device (IPD) 1400 is facing the front side of the die 1411. In some implementations, a front side is a side that includes solder interconnects and/or solder balls. It is noted that the integrated passive device (IPD) 1400 may be located differently. The die 1411 is configured to be electrically coupled to the tunable inductor (e.g., tunable inductor 200) of the integrated passive device (IPD) 1400.

The encapsulation layer 1416 is coupled to the package substrate 1410 and the die 1411. The encapsulation layer 1416 at least partially encapsulates the die 1411.

FIG. 15 illustrates another example of where an integrated passive device (IPD) may be positioned. FIG. 15 is similar to FIG. 14, except that the integrated passive device (IPD) 1400 is coupled to the printed circuit board (PCB) 1450. FIG. 15 illustrates that the integrated passive device (IPD) 1400 is coupled to the printed circuit board (PCB) 1450 such that the integrated passive device (IPD) 1400 is face to face with the die 1411. That is, the front side of the integrated passive device (IPD) 1400 is facing the front side of the die 1411.

Figure 16:
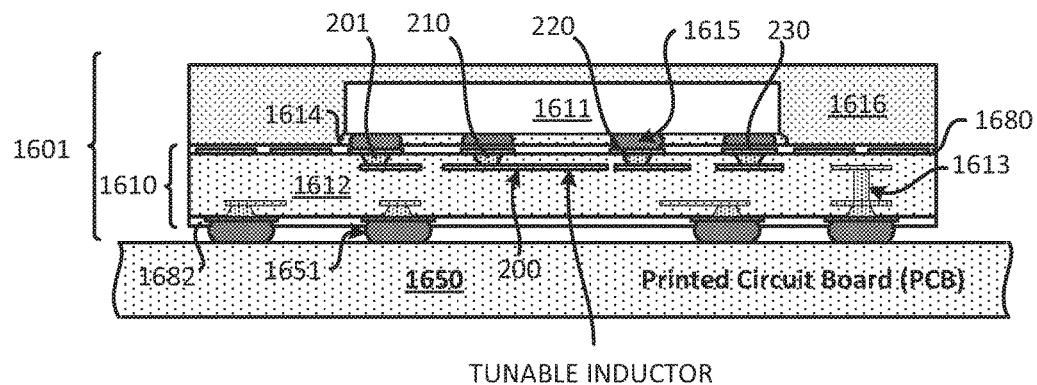
FIG. 16 illustrates a profile view of a tunable inductor in a package substrate.

Exemplary Integrated Device Package Comprising Tunable Inductor Implemented in Package Substrate As mentioned above, the tunable inductor 200 may be implemented in a package substrate of an integrated device package. FIG. 16 illustrates an example of an integrated device package 1601 that includes a tunable inductor 200 implemented in a package substrate 1610. The tunable inductor 200 may be a tunable inductive means or means for tunable inductance.

FIG. 16 illustrates an integrated device package 1601 that includes a package substrate 1610, a die 1611, an underfill 1614, a plurality of solder interconnects 1615 (e.g., solder balls), and an encapsulation layer 1616. The integrated device package 1601 is coupled to a printed circuit board (PCB) 1650 through a plurality of solder balls 1651.

The package substrate 1610 includes at least one dielectric layer 1612. The at least one dielectric layer 1612 may include a core layer and/or a prepeg layer. The package substrate 1610 also include a plurality of interconnects 1613. The package substrate 1610 may also include a first solder resist layer 1680 and a second solder resist layer 1682. The first solder resist layer 1680 is formed on a first surface of the package substrate 1610, and the second solder resist layer 1682 is formed on a second surface of the package substrate 1610.

The package substrate 1610 includes the tunable inductor 200, the first terminal 201, the second terminal 210, and the third terminal 220. The tunable inductor 200 is located in the at least one dielectric layer 1612. The tunable inductor 200 may include one or more interconnects (e.g., traces, pads). The tunable inductor 200 is coupled to the first terminal 201, the second terminal 210 and the third terminal 220. The first terminal 201 may include at least one interconnect (e.g., trace, pad, via). The second terminal 210 may include at least one interconnect (e.g., trace, pad, via). The third terminal 220 may include at least one interconnect (e.g., trace, pad, via). Two terminals may be live terminals, and one terminal may be a dummy terminal.

As shown in FIG. 16, the first terminal 201 and the third terminal 220 may be live terminals. The first terminal 201 may be a first port, and the third terminal 220 may be a second port. The first terminal 201 and the third terminal 220 are each coupled to a solder interconnect from the plurality of solder interconnects 1615 (e.g., solder balls). The second terminal 210 is not coupled to a solder interconnect. The second terminal 210 is a dummy terminal. The second terminal 210 is covered by the first solder resist layer 1680, which prevents a solder interconnect from the plurality of solder interconnects 1615 from coupling or touching the second terminal 210. Different implementations may have different configurations of live terminals and dummy terminals.

The encapsulation layer 1616 is coupled to the package substrate 1610 and the die 1611. The encapsulation layer 1616 at least partially encapsulates the die 1611.

Figure 17:
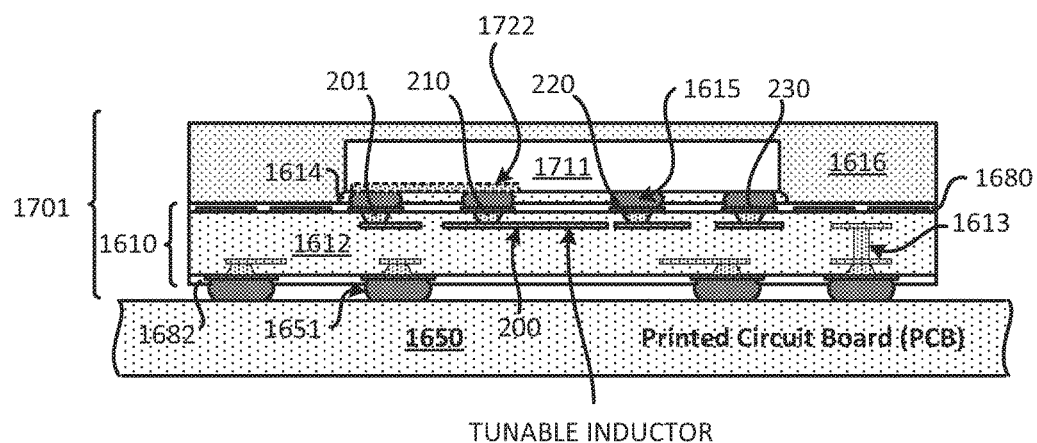
FIG. 17 illustrates a profile view of a real time tunable inductor in a package substrate.

Exemplary Integrated Device Package Comprising Real Time Tunable Inductor Implemented in Package Substrate As mentioned above, the tunable inductor 200 may be implemented by using one or more switches. FIG. 17 illustrates an example of an integrated device package 1701 that includes a tunable inductor 200 implemented in a package substrate 1610. The tunable inductor 200 is a real time tunable inductor that is configurable to have different inductances when the die and/or the integrated device package is operational. The real time tunable inductor may be a real time tunable inductive means or means for real time tunable inductance.

FIG. 17 is similar to FIG. 16, except that the die 1711 includes at least one switch 1722 (e.g., means for switching). The at least one switch 1722 may include transistors. The at least one switch 1722 may include a first switch, a second switch a, and a third switch, as described in FIG. 20. The die 1711 may also include a circuit for controlling the switch 1722.

FIG. 17 illustrates an integrated device package 1701 that includes a package substrate 1610, a die 1711, an underfill 1614, a plurality of solder interconnects 1615 (e.g., solder balls), and an encapsulation layer 1616. The integrated device package 1601 is coupled to a printed circuit board (PCB) 1650 through a plurality of solder balls 1651. The package substrate 1610 includes the tunable inductor 200, the first terminal 201, the second terminal 210, the third terminal 220, and the fourth terminal 230.

As mentioned above, the die 1711 includes at least one switch 1722. The at least one switch 1722 is configured to be electrically coupled to the tunable inductor 200. In some implementations, the at least one switch 1722 may be coupled to the first terminal 201, the second terminal 210, the third terminal 220, and the fourth terminal 230 of the tunable inductor 200.

Each particular switch is coupled to a particular terminal of the tunable inductor 200. Each particular switch is configured to control whether the terminal is on or off (e.g., whether a current or signal may pass through the terminal). When the switch is open, no current or signal may pass through the corresponding terminal. When the switch is closed, a current or signal may pass through the corresponding terminal.

Figure 20:
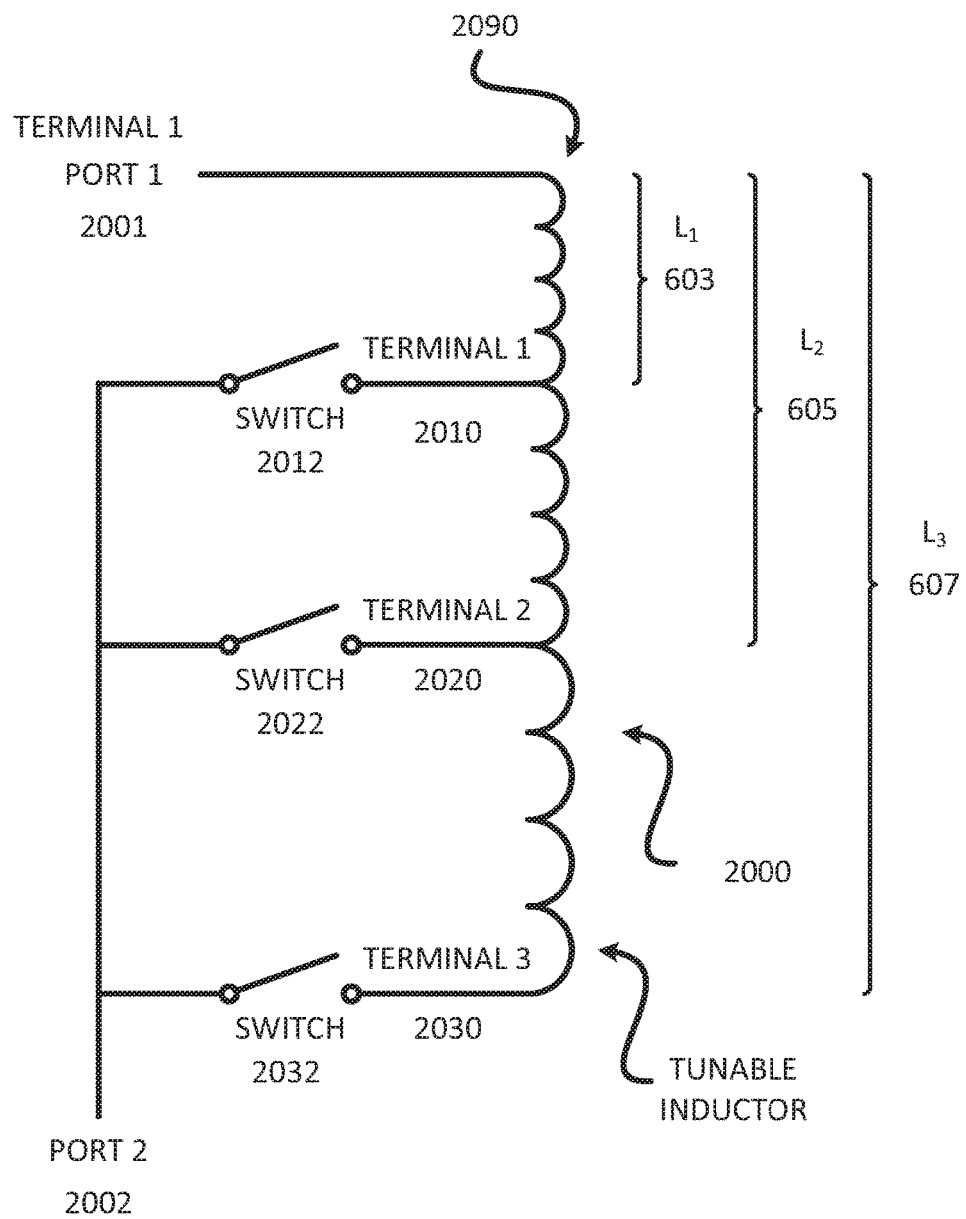
FIG. 20 illustrates a circuit diagram of a real time tunable inductor with all the switches open.

As will be further described in FIG. 20, the inductance of the tunable inductor 200 may be configured (e.g., tuned) by selectively opening and closing the switches coupled to the terminals of the tunable inductor 200.

Exemplary Integrated Passive Device (IPD) Comprising Real Time Tunable Inductor

Figure 18:
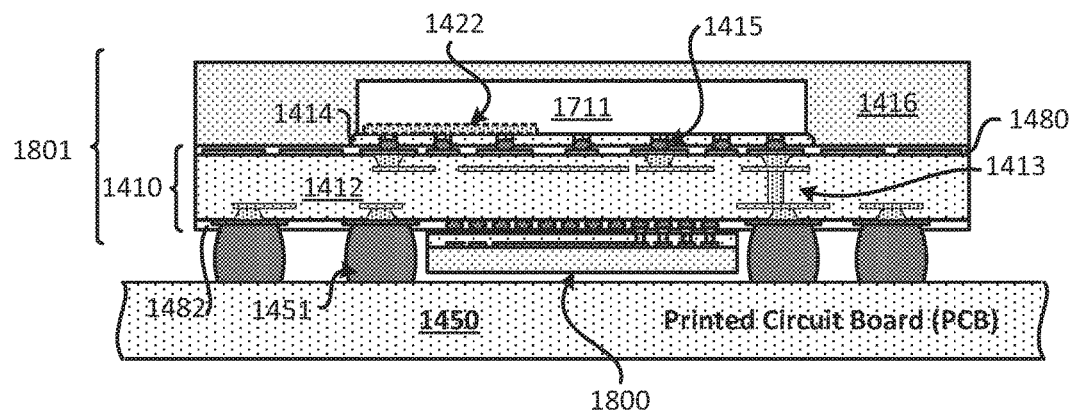
FIG. 18 illustrates a profile view of an integrated passive device (IPD) that includes a real time tunable inductor, coupled to a package.
Figure 19:
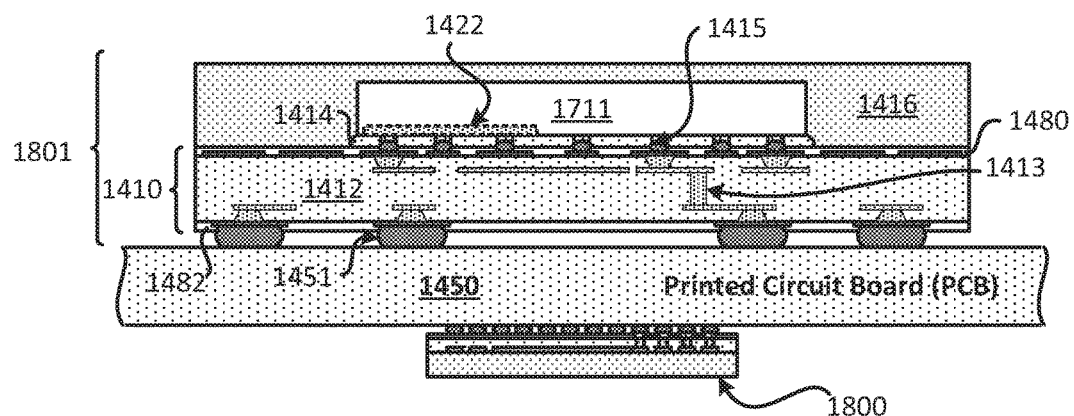
FIG. 19 illustrates a profile view of an integrated passive device (IPD) that includes a real time tunable inductor, coupled to a printed circuit board (PCB).

FIGS. 18-19 illustrate examples of where integrated passive devices (IPDs) may be implemented.

FIG. 18 illustrates an integrated device package 1801 that includes a package substrate 1410, a die 1711 and an integrated passive device (IPD) 1800 that includes a tunable inductor. The integrated passive device (IPD) 1800 may be any of the integrated passive device (IPD) that includes a tunable inductor, described in the present disclosure. The tunable inductor may be a tunable inductive means or means for tunable inductance. The integrated device package 1801 is coupled to a printed circuit board (PCB) 1450 through a plurality of solder balls 1451.

FIG. 18 is similar to FIG. 14, except that the die 1711 includes at least one switch 1722. The at least one switch 1722 is configured to be electrically coupled to the integrated passive device (IPD) 1800, which includes a tunable inductor (e.g., tunable inductor 200). The die 1711, which includes the at least one switch 1722, may be used to configured the inductance of the tunable inductor in the integrated passive device (IPD) 1800, when the die 1711 and/or the integrated device package 1801 is operational. Thus, the integrated passive device (IPD) 1800 may include a real time configurable tunable inductor.

FIG. 19 illustrates another example of where an integrated passive device (IPD) may be positioned. FIG. 19 is similar to FIG. 15, except that the die 1711 includes at least one switch 1722. The at least one switch 1722 is configured to be electrically coupled to the integrated passive device (IPD) 1800, which includes a tunable inductor (e.g., tunable inductor 200). The die 1711, which includes the at least one switch 1722, may be used to configured the inductance of the tunable inductor in the integrated passive device (IPD) 1800, when the die 1711 and/or the integrated device package 1801 is operational. Thus, the integrated passive device (IPD) 1800 may include a real time configurable tunable inductor.

Exemplary Circuit Diagram of a Real Time Tunable Inductor

FIG. 20 illustrates an example of a circuit diagram 2090 of a real time tunable inductor. The real time tunable inductor may be a real time tunable inductive means or means for real time tunable inductance. The circuit diagram 2090 includes a tunable inductor 2900, a first terminal 2001, a second terminal 2010, a third terminal 2020, a fourth terminal 2030, a first switch 2012, a second switch 2022, a third switch 2032, and a port 2002.

The tunable inductor 2000 may correspond to the tunable inductor 200 of FIGS. 17-19. The first terminal 2001 may correspond to the first terminal 201. The second terminal 2010 may correspond to the second terminal 210. The third terminal 2020 may correspond to the third terminal 220. The fourth terminal 2030 may correspond to the fourth terminal 230.

The first switch 2012 is coupled to the second terminal 2010. The second switch 2022 is coupled to the third terminal 2020. The third switch 2032 is coupled to the fourth terminal 2030. The first switch 2012, the second switch 2022, and the third switch 2032 are coupled to the port 2002. The first switch 2012, the second switch 2022, and the third switch 2032 may correspond to the at least one switch 1722 of FIGS. 17-19.

The inductance of the tunable inductor 2000 may be configured by selectively opening and closing the first switch 2012, the second switch 2022, and the third switch 2032. For example, when the first switch 2012 is closed and the second switch 2022 and the third switch 2032 are open, then the second terminal 2010 is coupled to the port 602.

When the tunable inductor 2000 includes the first terminal 2001 and the second terminal 2010 as the ports, the tunable inductor 2000 has a first inductance ($L_1$) 2003. When the tunable inductor 2000 includes the first terminal 2001 and the third terminal 2020 as the ports (e.g., second switch 2022 is closed, first switch 2012 and third switch 2032 are open), the tunable inductor 2000 has a second inductance ($L_2$) 2005. When the tunable inductor 2000 includes the first terminal 2001 and the fourth terminal 2030 as the ports (e.g., third switch 2032 is closed, first switch 2012 and second switch 2022 are open), the tunable inductor 2000 has a third inductance ($L_3$) 2007.

As described above, by selectively opening and closing the switches, the tunable inductor 2000 can be configured in real time to have different inductances, thus providing the tunable inductor 2000 that can be configured in real time during the operation of a die and/or an integrated device package. It is noted that different implementations may use different configurations of switches.

Exemplary Integrated Device Package Comprising a Real Time Tunable Inductor

Figure 21:
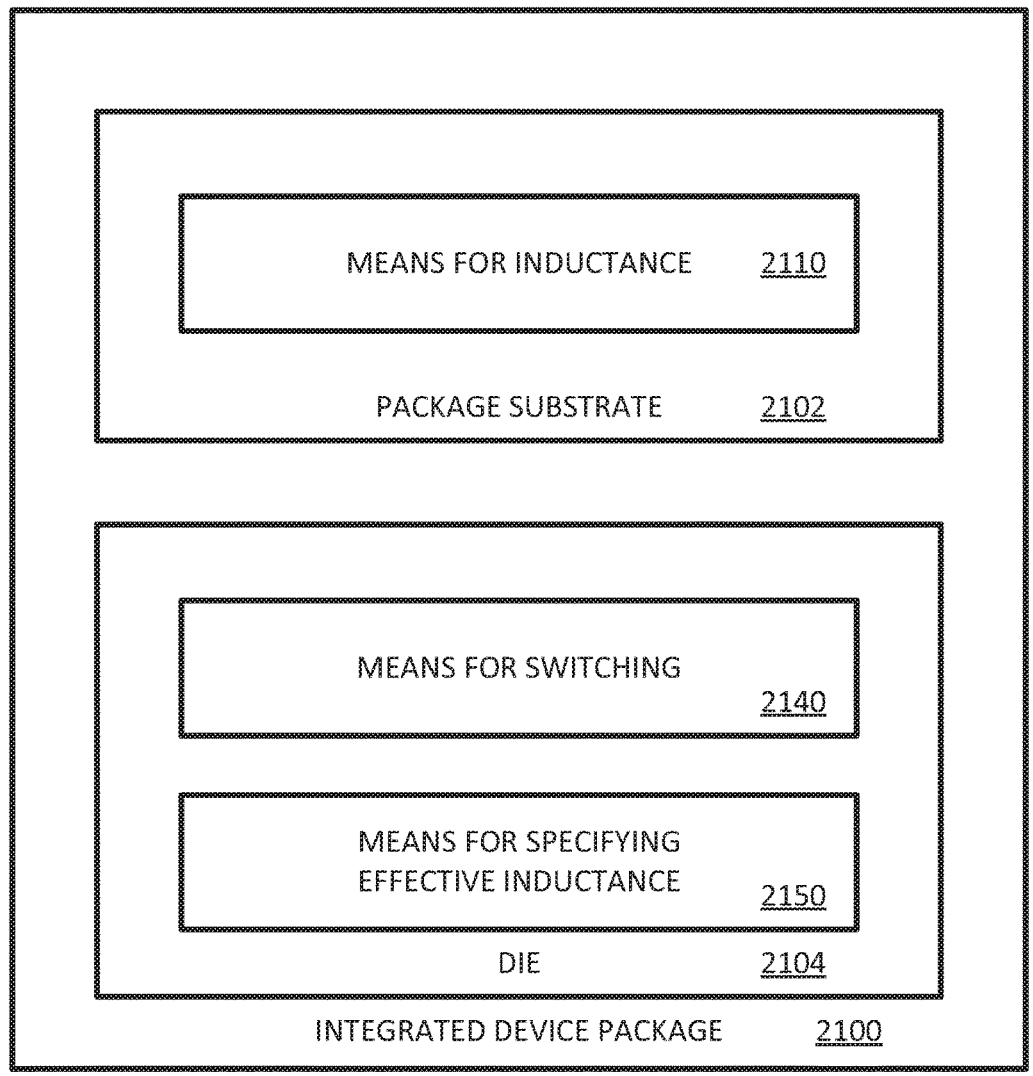
FIG. 21 illustrates various means implemented in a package substrate and a die to form a real time tunable inductor.

FIG. 21 illustrates a conceptual illustration of an integrated device package 2100 that includes a real time tunable inductor. The integrated device package 2100 includes a package substrate 2102 and a die 2104. The package substrate 2102 includes a means for inductance 2110. The die 2104 includes a means for switching 2140 and a means for specifying effective inductance 2150.

In some implementations, a real time tunable inductor is a means for real time tunable inductance that includes the means for inductance 2110, the means for switching 2140 and the means for specifying effective inductance 2150. The means for inductance 2110 may include the tunable inductor 200.

The means for inductance 2110 may include an integrated passive device (IPD) that includes a tunable inductor. The means for inductance 2110 may be located externally of the package substrate 2102. For example, the means for inductance 2110 may be coupled to a printed circuit board (PCB).

The means for switching 2140 may include the switch 1722, the first switch 2012, the second switch 2022, and/or the third switch 2032. The means for switching 2140 is coupled to the means for inductance 2110.

The means for specifying effective inductance 2150 may include circuits that are configured to control the means for switching 2140. The means for specifying effective inductance 2150 is coupled to the means for inductance 2110.

Exemplary Method for Real Time Tuning of an Inductor

Figure 22:
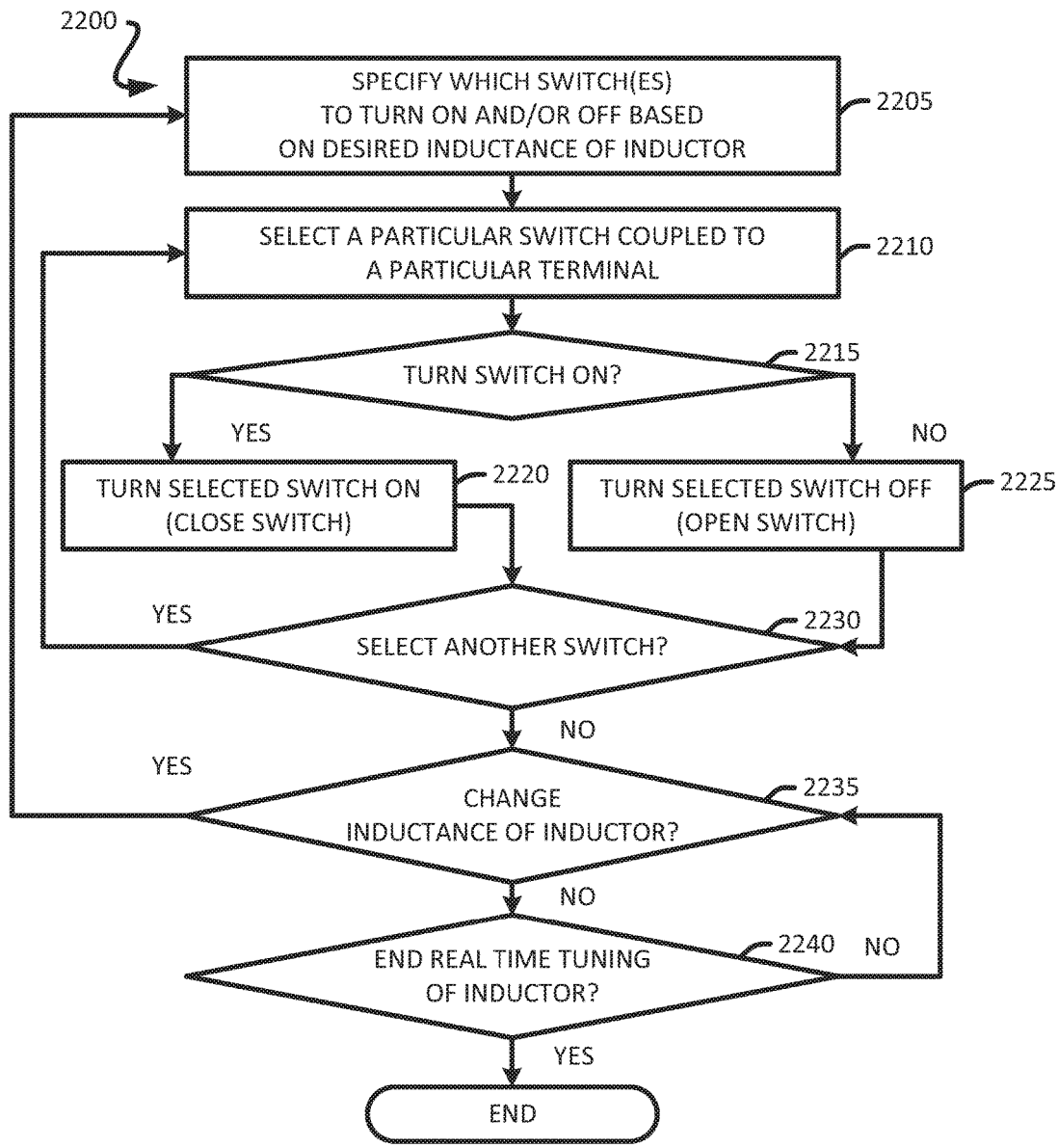
FIG. 22 illustrates a flow diagram of an exemplary method for providing real time tuning of inductor implemented in a package substrate.

FIG. 22 illustrates an exemplary method 2200 for real time tuning of an inductor. In some implementations, the tuning of the inductor is performed while a die and/or an integrated device package is operational. In some implementations, the method 2200 may be performed by an integrated device package (e.g., integrated device package 1701) that includes a tunable inductor (e.g., means for inductance) and at least one switch (e.g., means for switching).

In some implementations, the method 2200 is performed when a signal is transmitted through a tunable inductor implemented in a package substrate. In some implementations, the method 2200 is performed when a signal is transmitted through a tunable inductor implemented in an integrated passive device (IPD).

The method specifies (at 2205) which switch(es) (e.g., switch from a plurality of switches) to turn on and/or off based on a desired inductance of the tunable inductor (e.g., tunable inductor 200). Each particular switch (e.g., first switch 2012) is coupled to a particular terminal of the tunable inductor. It is noted that prior to specifying which switch to turn on or off, the switches may be on (e.g., closed switch) or off (e.g., open switch). That is, all the switches may be on, all the switches may be off, or some switches may be on while some switches may be off.

The method selects (at 2210) a particular switch coupled to particular a terminal (e.g., switch from a plurality of switches).

The method determines (at 2215) whether to turn the selected switch on. If so, the method turns the selected switch on (at 2220). In some implementations, turning the selected switch on (at 2220) includes closing the switch, which allows a current or a signal to pass through the terminal that is coupled to the selected switch.

When the method determines (at 2215) not to turn the selected switch on, the method proceeds to turn the selected switch off (at 2225). In some implementations, turning the selected switch off (at 2225) include opening the switch, which does not allow a current or a signal to pass through the terminal that is coupled to the selected switch.

The method determines (at 2230) whether to select another switch. If so, the method proceeds to select (at 2210) another switch coupled to another terminal. In some implementations, the method may iteratively select and turn on and off several switches, while a die and/or an integrated device package is operational.

When the method determines (at 2230) not to select another, the method determines (at 2235) whether to change the effective inductance of the tunable inductor. If so, the method proceeds back 2205 to specify which switches to turn on and off based on a desired effective inductance for the tunable inductor.

When the method determines (at 2235) not to change the effective inductance of the tunable inductor, the method then determines (at 2240) whether to end the real time tuning of the tunable inductor. If not, the method proceeds back to 2235. If the method determines to end the real time tuning of the tunable inductor, the method ends.

Figure 23:
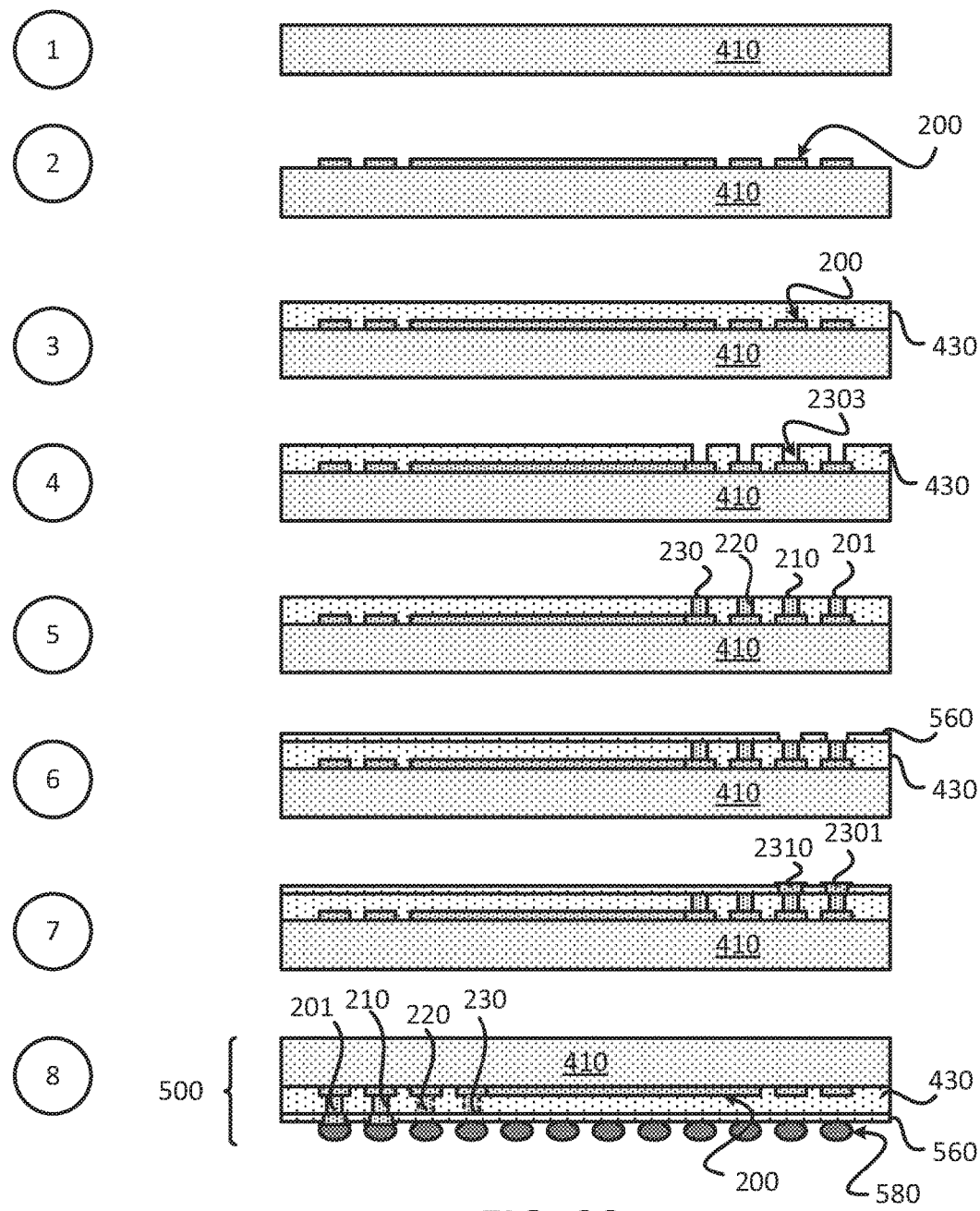
FIG. 23 illustrates a sequence for fabricating an integrated passive device (IPD) that includes a tunable inductor.

Exemplary Sequence for Fabricating an Integrated Passive Device (IPD) Comprising a Tunable Inductor In some implementations, providing/fabricating an integrated passive device (IPD) that includes a tunable inductor includes several processes. FIG. 23 illustrates an exemplary sequence for providing/fabricating an integrated passive device (IPD) that includes a real time tunable inductor. In some implementations, the sequence of FIG. 23 may be used to fabricate the integrated passive device (IPD) of FIG. 5 and/or other integrated passive devices (IPDs) described in the present disclosure. FIG. 23 will be described in the context of providing/fabricating the integrated passive device (IPD) 500 of FIG. 5.

It should be noted that the sequence of FIG. 23 may combine one or more stages in order to simplify and/or clarify the sequence for providing an IPD. In some implementations, the order of the processes may be changed or modified.

Stage 1 illustrates a substrate 410 provided. The substrate 410 may include a silicon substrate, a glass substrate, or a ceramic substrate. The first dielectric layer 2612 may be formed or provided by a supplier.

Stage 2 illustrates the tunable inductor 200 formed over the substrate 410. The tunable inductor 200 may be formed by metal layers over the substrate 410. A plating or depositing process may be used to form the metal layers that define the tunable inductor 200.

Stage 3 illustrates a dielectric layer 430 formed over the tunable inductor 200 and the substrate 410. The dielectric layer 430 may include a prepeg layer.

Stage 4 illustrates several cavities 2303 formed in the dielectric layer 430. Different implementations may form the cavities 2303 in the dielectric layer 430 differently. A laser process and/or a photo-lithography process may be used to form the cavities 2303.

Stage 5 illustrates the first terminal 201, the second terminal 210, the third terminal 220, and the fourth terminal 230 formed in the cavities 2303. The terminals include interconnects (e.g., vias) that traverse through the dielectric layer 430. A plating or depositing process may be used to form the metal layers that define the terminals (e.g., first terminal 201).

Stage 6 illustrates a solder resist layer 560 formed over the dielectric layer 430 and some of the terminals. As shown at stage 6, the solder resist layer 560 is formed over the third terminal 220 and the fourth terminal 230. Thus, the third terminal 220 and the fourth terminal 230 become dummy terminals.

Stage 7 illustrates a first interconnect 2301 (e.g., pad) formed over the first terminal 201, and a second interconnect 2310 (e.g., pad) formed over the second terminal 210. The first interconnect 2301 may be part of the first terminal 201. The second interconnect 2310 may be part of the second terminal 210. A plating or depositing process may be used to form the metal layers that define the interconnects.

Stage 8 illustrates a plurality of solder interconnects 580 (e.g., solder balls) formed over the solder resist layer 560, the first terminal 201, and the second terminal 210. The first terminal 201 and the second terminal 210 are live terminals. There is a solder interconnect over the third terminal 220, but is separated by the solder resist layer 560. Thus, there is no possible electrical coupling between the solder interconnect and the third terminal 220. Similarly, there is a solder interconnect over the fourth terminal 230, but is separated by the solder resist layer 560. Thus, there is no possible electrical coupling between the solder interconnect and the fourth terminal 230.

Figure 24:
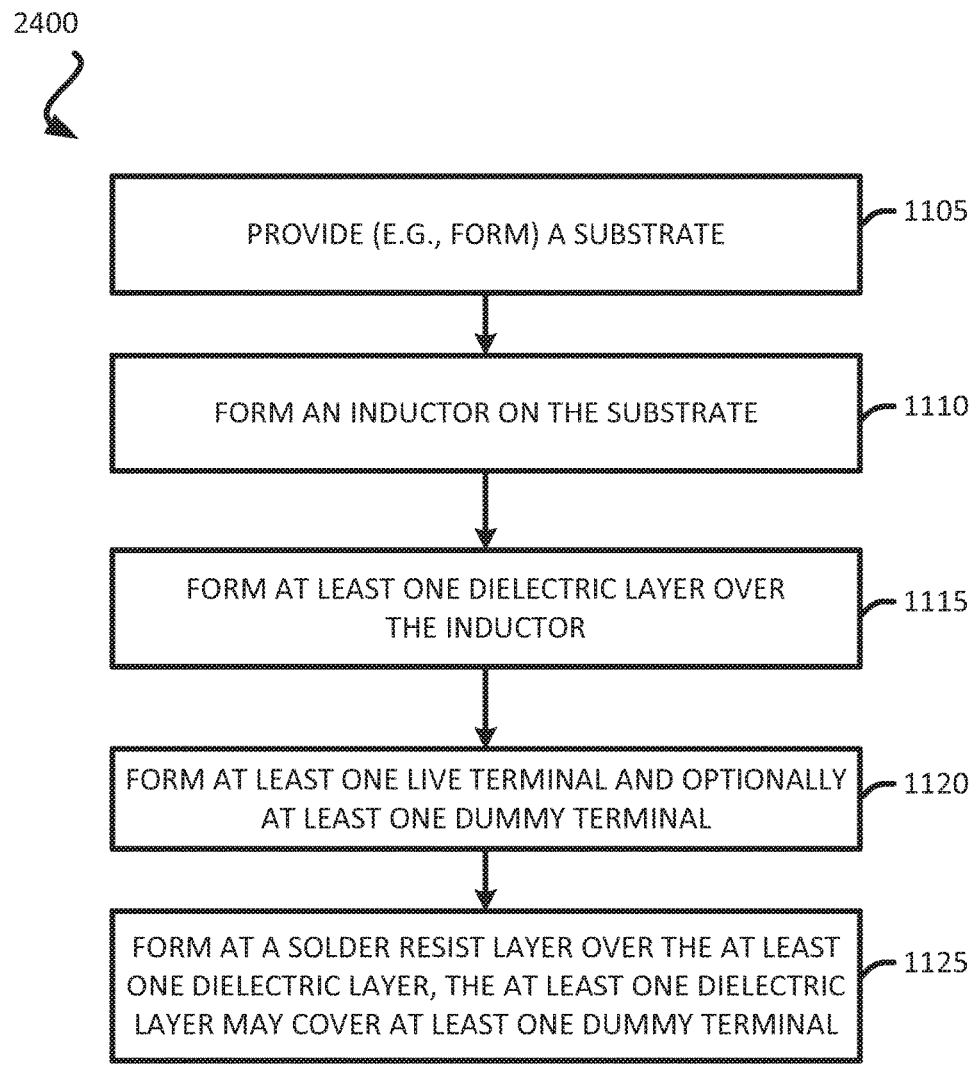
FIG. 24 illustrates a flow diagram of an exemplary method for fabricating an integrated passive device (IPD) that includes a tunable inductor.

Exemplary Method for Fabricating an Integrated Passive Device (IPD) Comprising a Tunable Inductor In some implementations, providing/fabricating an integrated passive device (IPD) that includes a tunable inductor includes several processes. FIG. 24 illustrates an exemplary flow diagram of a method for providing/fabricating an integrated passive device (IPD) that includes a tunable inductor. In some implementations, the method of FIG. 24 may be used to provide/fabricate the integrated passive device (IPD) that includes a tunable inductor of FIGS. 5, 7, 9 and/or other integrated passive devices (IPDs) described in the present disclosure. FIG. 24 will be described in the context of providing/fabricating the integrated passive device (IPD) 500 of FIG. 15.

It should be noted that the flow diagram of FIG. 24 may combine one or more processes in order to simplify and/or clarify the method for providing an integrated passive device (IPD) that includes a real time tunable inductor. In some implementations, the order of the processes may be changed or modified.

The method forms (at stage 2405) a substrate (e.g., substrate 410). The substrate may include a silicon substrate, a glass substrate or a ceramic substrate.

The method forms (at 2410) an inductor (e.g., tunable inductor 200) over the substrate. The inductor may be formed by metal layers over the substrate. A plating or depositing process may be used to form the metal layers that define the inductor.

The method forms (at 2415) at least one dielectric layer (e.g., dielectric layer 430) over the inductor and the substrate.

The method forms (at 2420) at least one live terminal (e.g., first terminal 201) and at least one dummy terminal (e.g., third terminal 220). A terminal may include one or more interconnects (e.g., trace, pad, via).

The method forms (at 2425) a solder resist layer (e.g., solder resist layer 560) over the at least one dielectric layer. In some implementations, the solder resist layer may be formed over a terminal (e.g. dummy terminal).

The method may also couple at least one solder interconnect (e.g., solder ball) to the solder resist layer and/or a terminal.

Figure 25A:
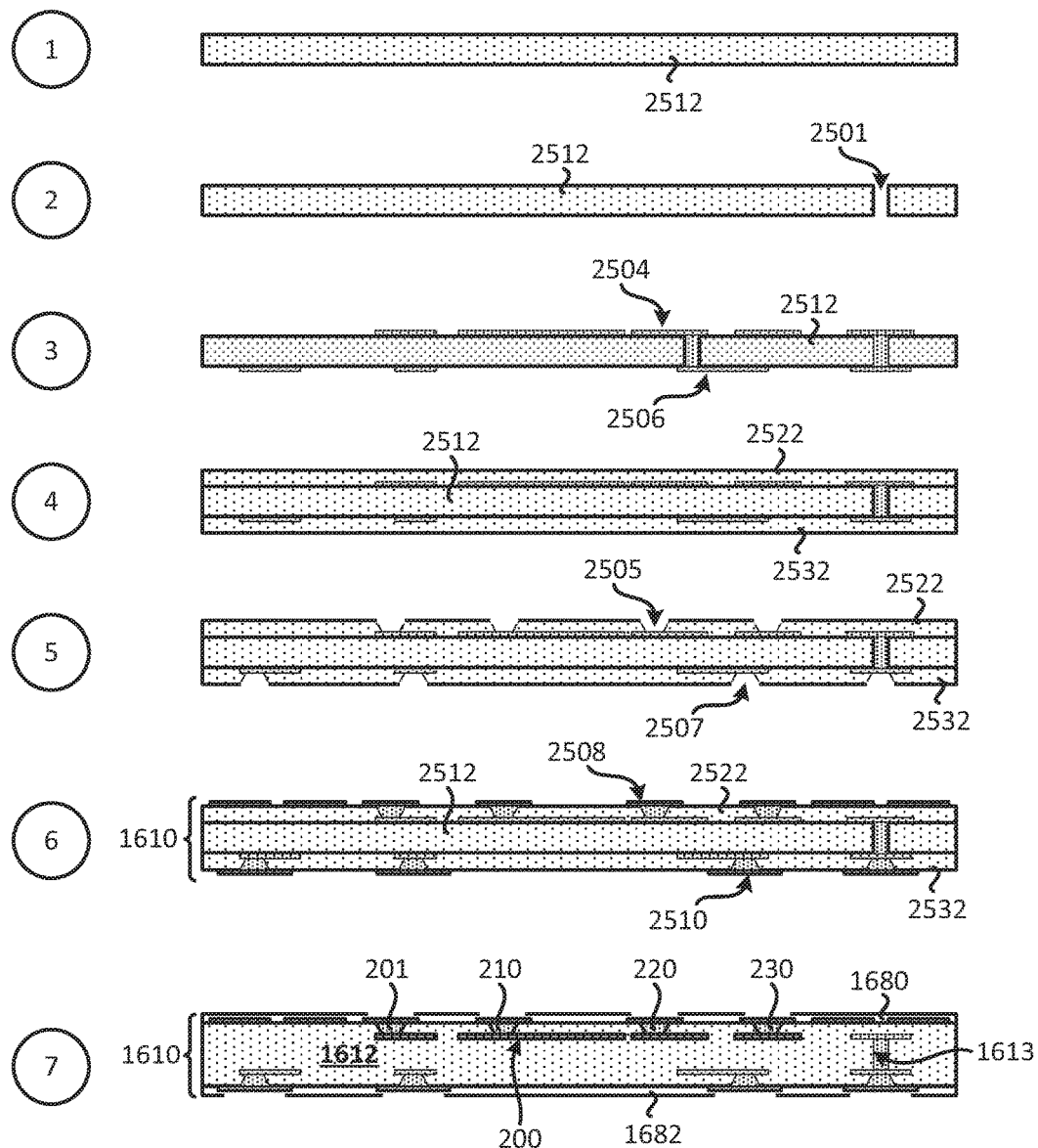
FIG. 25 (which includes FIGS. 25A-25B) illustrates a flow diagram of an exemplary method for fabricating an integrated device package that includes a real time tunable inductor implemented in a package substrate.
Figure 25B:
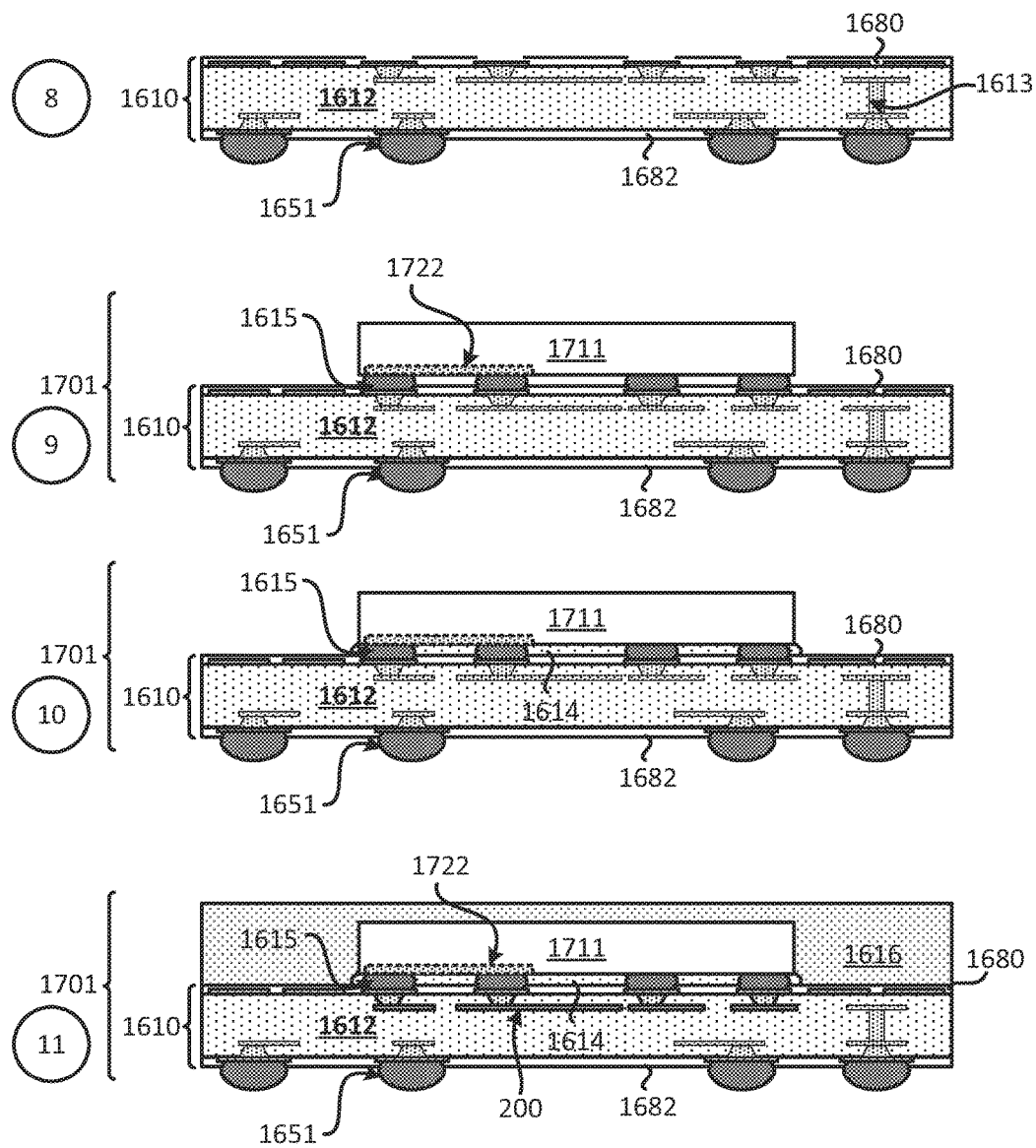

Exemplary Sequence for Fabricating an Integrated Device Packages Comprising a Real Time Tunable Inductor In some implementations, providing/fabricating an integrated device package that includes a real time tunable inductor includes several processes. FIG. 25 (which includes FIGS. 25A-25B) illustrates an exemplary sequence for providing/fabricating an integrated device package that includes a real time tunable inductor. In some implementations, the sequence of FIGS. 25A-25B may be used to fabricate the integrated device package that includes a real time tunable inductor package of FIG. 17 and/or other integrated device packages (that includes tunable inductor) described in the present disclosure. FIGS. 25A-25B will be described in the context of providing/fabricating the integrated device package of FIG. 17. In particular, FIGS. 25A-25B will be described in the context of fabricating the integrated device package 1701 of FIG. 17.

It should be noted that the sequence of FIGS. 25A-25B may combine one or more stages in order to simplify and/or clarify the sequence for providing a package. In some implementations, the order of the processes may be changed or modified.

Stage 1, as shown in FIG. 25A, illustrates a first dielectric layer 2512 provided. The first dielectric layer 2512 may be a core layer. The first dielectric layer 2512 may be formed or provided by a supplier.

Stage 2 illustrates at least one cavity 2501 formed in the first dielectric layer 2512. Different implementations may form the cavity 2501 in the first dielectric layer 2512 differently. A laser process and/or a photo-lithography process may be used to form the cavity 2501.

Stage 3 illustrates a first metal layer 2504 and a second metal layer 2506 formed on and/or in the first dielectric layer 2512. The first metal layer 2504 and the second metal layer 2506 may represent the plurality of interconnects 1613, as described above in at least FIG. 16. Some of the metal layers (e.g., first metal layer 2504) may form part of or all of the tunable inductor 200.

Stage 4 illustrates a second dielectric layer 2522 and a third dielectric layer 2532 formed on the first dielectric layer 2512.

Stage 5 illustrates at least one cavity 2505 formed in the second dielectric layer 2522, and at least one cavity 2507 formed in the third dielectric layer 2532. Different implementations may form the cavity 2505 in the second dielectric layer 2522 and the cavity 2507 in the third dielectric layer 2532 differently. A laser process and/or a photo-lithography process may be used to form the cavity 2505 and/or the cavity 2507.

Stage 6 illustrates a third metal layer 2508 formed on and/or in the second dielectric layer 2522, a fourth metal layer 2510 formed on and/or in the third dielectric layer 2532. The third metal layer 2508 and the fourth metal layer 2510 may represent the plurality of interconnects 1413, as described above in at least FIG. 17. Stage 6 may represent a package substrate (e.g., package substrate 1610) that includes at least one dielectric layer and a plurality of interconnects.

Stage 7 illustrates a first solder resist layer 1680 formed over the dielectric layer 1612, and a second solder resist layer 1682 formed over the dielectric layer 1612. The dielectric layer 1612 may collectively represent the first dielectric layer 2512, the second dielectric layer 2522, and the third dielectric layer 2532. Stage 7 may represent a package substrate (e.g., package substrate 1610) that includes the dielectric layer 1612, the plurality of interconnects 1613, the first solder resist layer 1680, and the second solder resist layer 1682. Stage 7 also illustrates that the package substrate 1610 includes the tunable inductor 200 that is formed in the dielectric layer 1612. The tunable inductor 200, the first terminal 201, the second terminal 210, the third terminal 220, and the fourth terminal 230 may be formed by interconnects in the package substrate 1410. In different implementations, the first solder resist layer 1680 may be formed over one or more of the first terminal 201, the second terminal 210, the third terminal 220, and the fourth terminal 230.

Stage 8, as shown in FIG. 25B, illustrates the plurality of solder balls 1651 coupled to the package substrate 1610. In particular, the plurality of solder balls 1652 is coupled to the plurality of interconnects 1613.

Stage 9 illustrates the die 1711 coupled to the package substrate 1610, through the plurality of solder interconnects 1615 (e.g., solder balls). The solder interconnects 1615 are coupled to the first terminal 201, the second terminal 210, the third terminal 220, and the fourth terminal 230. Different implementations may couple the die 1711 to the package substrate 1610 differently (e.g., by using interconnect pillars). In some implementations, a reflow process (e.g., chip attach reflow process) may be used to couple the die 1711 to the package substrate 1610. In some implementations, a reflux process may be used after the reflow process. The die 1711 may include at least one switch 1722.

Stage 10 illustrates an underfill 1614 provided between the die 1711 and the package substrate 1610. The underfill 1614 may at least partially surround the plurality of solder interconnects 1615. In some implementations, providing the underfill 1614 includes an underfill dispense process.

Stage 11 illustrates an encapsulation layer 1616 that is formed over the package substrate 1610 and the die 1711. The encapsulation layer 1616 at least partially encapsulates the die 1711. Stage 11 may illustrates an integrated device package 1601 that includes the package substrate 1610, the die 1711, the tunable inductor 200 and the switch 1722.

In some implementations, several packages (e.g., integrated device packages) are concurrently fabricated on wafer, and a singulation process is performed to cut a wafer into individual packages.

Figure 26:
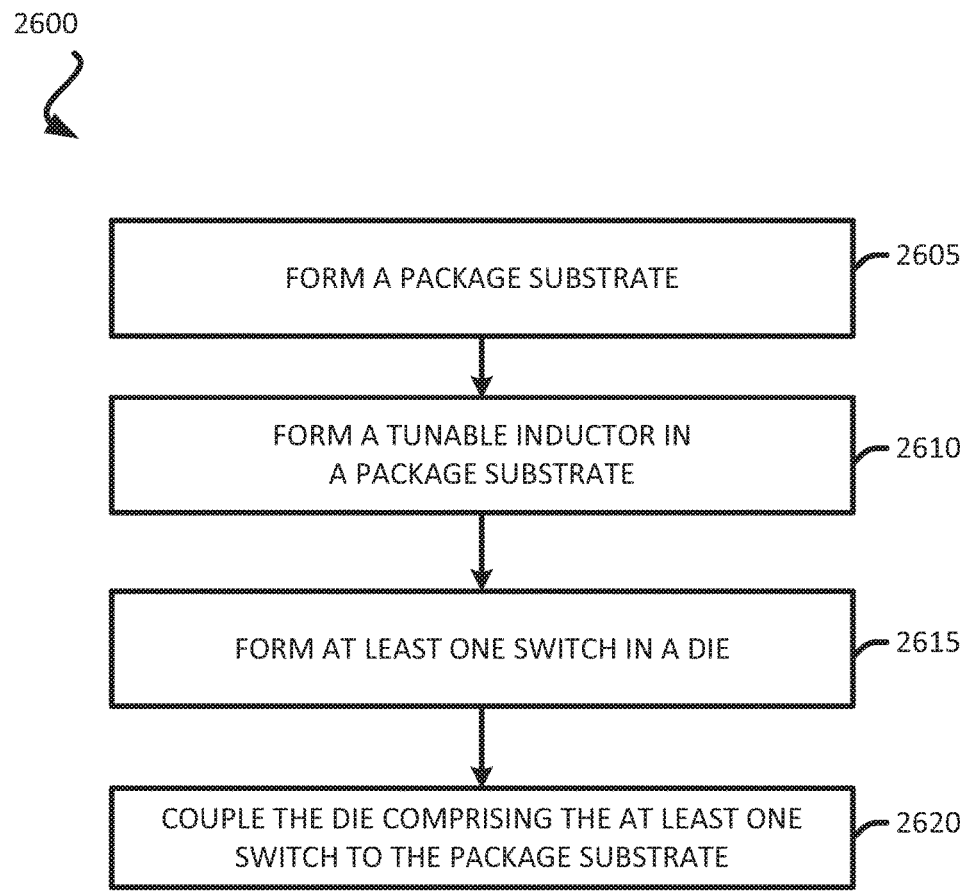
FIG. 26 illustrates an example of a sequence for fabricating an integrated device package that includes a real time tunable inductor implemented in a package substrate.
Figure 27:
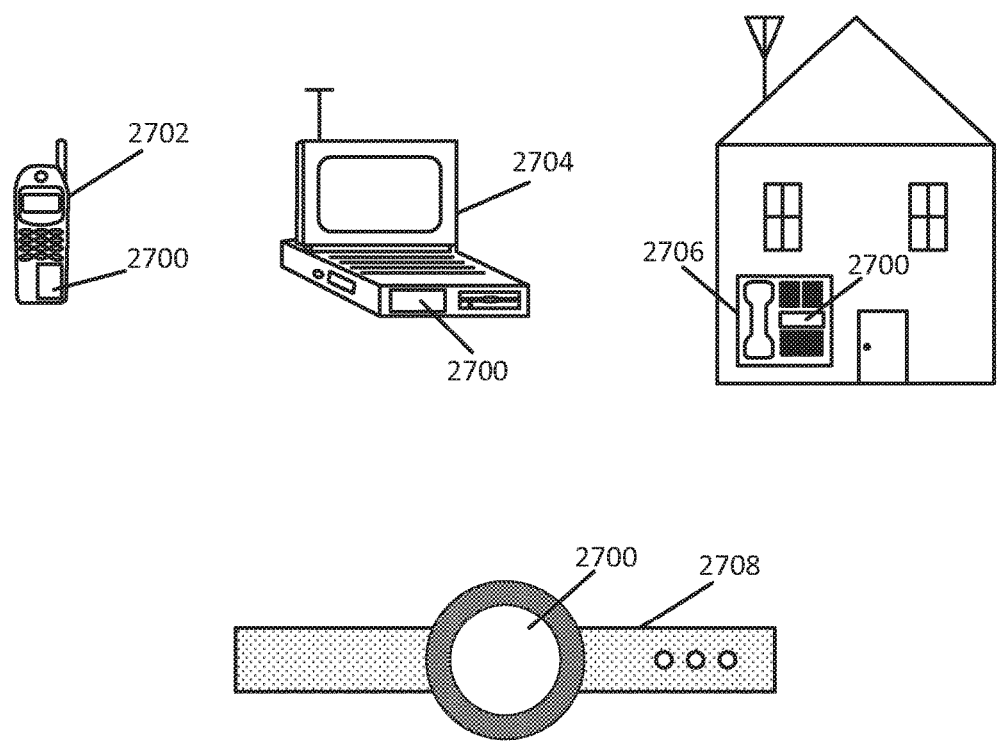
FIG. 27 illustrates various electronic devices that may include the various integrated devices, integrated device packages, semiconductor devices, dies, integrated circuits, and/or packages described herein.

Exemplary Method for Fabricating an Integrated Device Packages Comprising a Real Time Tunable Inductor In some implementations, providing/fabricating an integrated device package that includes a real time tunable inductor includes several processes. FIG. 26 illustrates an exemplary flow diagram of a method for providing/fabricating an integrated device package that includes a real time tunable inductor. In some implementations, the method of FIG. 26 may be used to provide/fabricate the integrated device package that includes a real time tunable inductor of FIG. 17 and/or other integrated device packages described in the present disclosure. FIG. 26 will be described in the context of providing/fabricating the integrated device package 1701 of FIG. 17.

It should be noted that the flow diagram of FIG. 26 may combine one or more processes in order to simplify and/or clarify the method for providing an integrated device package that includes a real time tunable inductor. In some implementations, the order of the processes may be changed or modified.

The method forms (at stage 2605) a package substrate (e.g., package substrate 1610) that includes at least one dielectric layer (e.g., dielectric layer 1612). In some implementations, forming the package substrate includes forming at least one metal layer and at least one solder resist layer.

The method forms (at 2610) a tunable inductor (e.g., tunable inductor 200) in the package substrate. In some implementations, forming the tunable inductor may include forming interconnects (e.g., traces, pads, vias) in the package substrate. In some implementations, forming the tunable inductor include forming several terminals for the tunable inductor. The terminals may include live terminals and/or dummy terminals. A terminal may include at least one interconnect (e.g., trace, pad, via).

The method forms (at 2615) at least one switch (e.g., switch 1722) in a die (e.g., die 1711). In some implementations, forming the at least one switch includes forming a transistor in the die.

The method couples (at 2620) the die comprising the at least switch to the package substrate, such that the at least one switch is coupled to the at least one terminal. In some implementations, the die is coupled to the package substrate such that the die is coupled to the tunable inductor.

Exemplary Electronic Devices

FIG. 26 illustrates various electronic devices that may be integrated with any of the aforementioned integrated device, semiconductor device, integrated circuit, die, interposer, package or package-on-package (PoP). For example, a mobile phone device 2602, a laptop computer device 2604, a fixed location terminal device 2606, a wearable device 2608 may include an integrated device 2600 as described herein. The integrated device 2600 may be, for example, any of the integrated circuits, dies, integrated devices, integrated device packages, integrated circuit devices, device packages, integrated circuit (IC) packages, package-on-package devices described herein. The devices 2602, 2604, 2606, 2608 illustrated in FIG. 26 are merely exemplary. Other electronic devices may also feature the integrated device 2600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2, 3, 4, 5, 6, 7, 8, 9, 10, 11, 12, 13, 14, 15, 16, 17, 18, 19, 20, 21, 22, 23, 24, 25A-25B, 26, and/or 27 may be rearranged and/or combined into a single component, process, feature or function or embodied in several components, processes, or functions. Additional elements, components, processes, and/or functions may also be added without departing from the disclosure. It should also be noted that FIGS. 2, 3, 4, 5, 6, 7, 8, 9, 10, 11, 12, 13, 14, 15, 16, 17, 18, 19, 20, 21, 22, 23, 24, 25A-25B, 26, and/or 27 and its corresponding description in the present disclosure is not limited to dies and/or ICs. In some implementations, FIGS. 2, 3, 4, 5, 6, 7, 8, 9, 10, 11, 12, 13, 14, 15, 16, 17, 18, 19, 20, 21, 22, 23, 24, 25A-25B, 26, and/or 27 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

One or more devices (e.g., die) in an integrated device package may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium and/or a processor-readable medium. The computer-readable medium and/or a processor-readable medium may be a non-transitory computer-readable medium and/or a non-transitory processor-readable medium. A non-transitory computer-readable medium and/or a non-transitory processor-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may reside in a memory of an integrated device package, external to the integrated device package, or distributed across multiple entities including the integrated device package. The computer-readable medium and/or the processor-readable medium may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The algorithms described herein may also be efficiently implemented in software and/or embedded in hardware. It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein. Additional elements, components, steps, and/or functions may also be added or not utilized without departing from the disclosure.

Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. In some aspects, a process may correspond to a method, a function, a procedure, a subroutine, a subprogram, etc. When a process corresponds to a function, its termination corresponds to a return of the function to the calling function or the main function. One or more of the various methods described herein may be partially or fully implemented by programming (e.g., instructions and/or data) that may be stored in a machine-readable, computer-readable, and/or processor-readable storage medium, and executed by one or more processors, machines and/or devices. A processor may include one or more processors. A processor may include one or more processor core.

Those of skill in the art would further appreciate that the various illustrative logical blocks, modules, circuits, and algorithm steps described in connection with the implementations disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
   a substrate;
   at least one dielectric layer coupled to the substrate;
   an inductor in the at least one dielectric layer, wherein the inductor comprises a spiral inductor;
   a first terminal coupled to the inductor, the first terminal comprising a first via and a first pad, wherein the first terminal is configured to be a first port for the inductor;
   a second terminal coupled to the inductor, the second terminal comprising a second via and a second pad, wherein the second terminal is configured to be a second port for the inductor;
   a third terminal coupled to the inductor, the third terminal comprising a third via, wherein the third terminal is a dummy terminal;
   a solder resist layer coupled to the dielectric layer and the third via of the third terminal, wherein the solder resist layer covers the third via of the third terminal;
   a first solder interconnect coupled to the first terminal;
   a second solder interconnect coupled to the second terminal; and
   a third solder interconnect over the third via of the third terminal, the third solder interconnect coupled to the solder resist layer such that the solder resist layer is between the third via of the third terminal and the third solder interconnect, wherein the solder resist layer prevents a direct electrical coupling between the third via of the third terminal and the third solder interconnect.

2. The device of claim 1, further comprising a fourth terminal coupled to the inductor, wherein the fourth terminal is a dummy terminal.

3. The device of claim 1, wherein the device is coupled to a die comprising a plurality of switches.

4. The device of claim 3, wherein the plurality of switches comprises a first switch and a second switch, and wherein the first switch is coupled to the second terminal, and the second switch is coupled to the third terminal.

5. The device of claim 1, wherein the device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

6. The device of claim 1, further comprising
   an integrated package comprising a die, the integrated package coupled to the first solder interconnect, the second solder interconnect, and the third solder interconnect; and
   a printed circuit board (PCB) coupled to the integrated package such that the inductor is located between the printed circuit board (PCB) and the integrated package.

7. The device of claim 1, further comprising
   an integrated package comprising a die; and
   a printed circuit board (PCB) coupled to the integrated package, the first solder interconnect, the second solder interconnect, and the third solder interconnect, such that the printed circuit board (PCB) is located between the integrated package and the inductor.

8. The device of claim 1, wherein the device is an integrated passive device (IPD).

9. An apparatus comprising:
   an integrated passive device comprising:
      a substrate;
      at least one dielectric layer coupled to the substrate;
      a means for inductance in the at least one dielectric layer;
      a first terminal coupled to the means for inductance, the first terminal comprising a first via and a first pad, wherein the first terminal is configured to be a first port for the means for inductance;
      a second terminal coupled to the means for inductance, the second terminal comprising a second via and a second pad;
      a third terminal coupled to the means for inductance, the third terminal comprising a third via;
      a fourth terminal coupled to the means for inductance, the fourth terminal comprising a fourth via;
      a solder resist layer over the dielectric layer, wherein the solder resist layer covers the fourth terminal; and
      a solder interconnect over the fourth terminal, such that the solder resist layer is between the fourth terminal and the solder interconnect; and
   a die coupled to the integrated passive device, the die comprising:
      a first switch coupled to the second terminal of the means for inductance;
      a second switch coupled to the third terminal of the means for inductance; and
      a circuit configured to control the first switch and the second switch such that the means for inductance comprises a real time tunable inductor that includes different inductances during an operation of the die, wherein when the first switch is configured to be closed and the second switch is configured to be open, the second terminal is configured to be an active port for the means for inductance, and the third terminal is configured to be a dummy terminal for the means for inductance, wherein when the first switch is configured to be open and the second switch is configured to be closed, the second terminal is configured to be a dummy terminal for the means for inductance, and the third terminal is configured to be an active terminal for the means for inductance.

10. The apparatus of claim 9, wherein the fourth terminal is a dummy terminal for the means for inductance.

11. The apparatus of claim 9, wherein the integrated passive device further comprises a fifth terminal coupled to the means for inductance, and the die further comprises a third switch coupled to the fifth terminal of the means for inductance, wherein when the first switch is configured to be closed, the second switch is configured to be open and the third switch is configured to be open, the second terminal is configured to be an active port for the means for inductance, and the third terminal and the fifth terminal are configured to be dummy terminals for the means for inductance, wherein when the first switch is configured to be open, the second switch is configured to be closed and the third switch is configured to be open, the third terminal is configured to be an active port for the means for inductance, and the second terminal and the fifth terminal are configured to be dummy terminals for the means for inductance, wherein when the first switch is configured to be open, the second switch is configured to be open and the third switch is configured to be closed, the fifth terminal is configured to be an active port for the means for inductance, and the second terminal and the third terminal are configured to be dummy terminals for the means for inductance.

12. The apparatus of claim 11, wherein the circuit is configured for controlling the first switch, the second switch and the third switch.

13. The apparatus of claim 9, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

14. The apparatus of claim 9, further comprising
an integrated package comprising the die and a package substrate, the integrated package coupled to the integrated passive device; and a printed circuit board (PCB) coupled to the integrated package such that the integrated passive device is located between the printed circuit board (PCB) and the integrated package.

15. The apparatus of claim 9, further comprising
an integrated package comprising the die and a package substrate; and
a printed circuit board (PCB) coupled to the integrated package and the integrated passive device such that the printed circuit board (PCB) is located between the integrated package and the integrated passive device.

16. An apparatus comprising:
an integrated passive device comprising:
a substrate;
at least one dielectric layer coupled to the substrate;
means for inductance in the at least one dielectric layer;
a first terminal coupled to the means for inductance, the first terminal comprising a first via and a first pad, wherein the first terminal is configured to be a first port for the means for inductance;
a second terminal coupled to the means for inductance, the second terminal comprising a second via and a second pad, wherein the second terminal is configured to be a second port for the means for inductance;
a third terminal coupled to the means for inductance, the third terminal comprising a third via, wherein the third terminal is a dummy terminal;
a solder resist layer coupled to the dielectric layer and the third via of the third terminal, wherein the solder resist layer covers the third via of the third terminal;
a first solder interconnect coupled to the first terminal;
a second solder interconnect coupled to the second terminal; and
a third solder interconnect over the third via of the third terminal, the third solder interconnect coupled to the solder resist layer such that the solder resist layer is between the third via of the third terminal and the third solder interconnect, wherein the solder resist layer prevents the third via of the third terminal from directly touching the third solder interconnect; and
a die coupled to the integrated passive device.

17. The apparatus of claim 16, wherein the solder resist layer prevents a direct electrical coupling between the third via of the third terminal and the third solder interconnect.

18. The apparatus of claim 16, further comprising a fourth terminal coupled to the means for inductance, wherein the fourth terminal is a dummy terminal.

19. The apparatus of claim 16, wherein the integrated passive device is coupled to a die comprising means for switching.

20. The apparatus of claim 19, wherein the means for switching comprises a first switch and a second switch, and wherein the first switch is coupled to the second terminal, and the second switch is coupled to a fourth terminal.

* * * * *